(12) United States Patent
Jeon

(10) Patent No.: US 11,770,944 B2
(45) Date of Patent: Sep. 26, 2023

(54) LIGHT EMITTING DISPLAY DEVICE WITH AN OPTICAL COMPENSATION LAYER

(71) Applicant: LG Display Co., Ltd., Seoul (KR)

(72) Inventor: Ji Na Jeon, Seoul (KR)

(73) Assignee: LG Display Co., Ltd., Seoul (KR)

( * ) Notice: Subject to any disclaimer, the term of this patent is extended or adjusted under 35 U.S.C. 154(b) by 126 days.

(21) Appl. No.: 17/236,944

(22) Filed: Apr. 21, 2021

(65) Prior Publication Data

US 2022/0209172 A1    Jun. 30, 2022

(30) Foreign Application Priority Data

Dec. 24, 2020   (KR) .......................... 10-2020-0183654

(51) Int. Cl.
*H10K 50/818*    (2023.01)
*H10K 50/18*     (2023.01)
*H10K 59/12*     (2023.01)
*H10K 102/00*    (2023.01)

(52) U.S. Cl.
CPC ........... *H10K 50/818* (2023.02); *H10K 50/18* (2023.02); *H10K 59/12* (2023.02); *H10K 2102/351* (2023.02)

(58) Field of Classification Search
CPC ............. H01L 51/5218; H01L 27/3244; H01L 51/5096; H01L 2251/558; H01L 27/3209; H01L 27/3246; H01L 51/5064; H01L 51/5265; H01L 27/3211; H01L 51/5203; H01L 51/5278

See application file for complete search history.

(56) References Cited

U.S. PATENT DOCUMENTS

| | | | |
|---|---|---|---|
| 8,227,816 B2 | 7/2012 | Kim et al. | |
| 10,347,694 B2 | 7/2019 | Li et al. | |
| 2008/0238297 A1* | 10/2008 | Oota | H10K 71/00 313/500 |
| 2010/0193794 A1 | 8/2010 | Kim et al. | |
| 2011/0163339 A1* | 7/2011 | Negishi | H10K 50/852 977/755 |
| 2014/0008631 A1* | 1/2014 | Tsuji | H01L 51/5044 257/40 |
| 2018/0286929 A1 | 10/2018 | Li et al. | |
| 2018/0375050 A1* | 12/2018 | Ito | H10K 50/16 |
| 2019/0036033 A1* | 1/2019 | Nakanotani | H01L 51/50 |
| 2020/0035951 A1* | 1/2020 | Cheon | H10K 50/18 |

FOREIGN PATENT DOCUMENTS

| | | | |
|---|---|---|---|
| JP | 6665885 B2 | 3/2020 | |
| KR | 20070058765 A * | 6/2007 | ............. H05B 33/22 |
| KR | 10-0994120 B1 | 11/2010 | |
| KR | 10-2098378 B1 | 4/2020 | |

OTHER PUBLICATIONS

Komatsu, Hiroshi English Machine Translation of Korean Pub. No. KIR200700589765 (Year: 2023).*

* cited by examiner

*Primary Examiner* — Donald L Raleigh
(74) *Attorney, Agent, or Firm* — Fenwick & West LLP

(57) ABSTRACT

Disclosed is a light emitting display device in which an optical compensation layer for compensating for an optical distance in each of subpixels configured to emit light with different colors is provided together with formation of a thin film transistor array so as to decrease a driving voltage value required to drive an organic stack and to improve processibility.

20 Claims, 13 Drawing Sheets

LIGHT EMITTING DISPLAY DEVICE WITH AN OPTICAL COMPENSATION LAYER

CROSS-REFERENCE TO RELATED APPLICATION

This application claims the benefit of Republic of Korea Patent Application No. 10-2020-0183654, filed on Dec. 24, 2020, which is hereby incorporated by reference in its entirety.

BACKGROUND

Field of Technology

The present disclosure relates to a display device, and more particularly, to a light emitting display device in which an optical compensation layer for compensating for an optical distance in each of subpixels configured to emit light with different colors is provided together with formation of a thin film transistor array so as to decrease a driving voltage value required to drive an organic stack and to improve processibility.

Discussion of the Related Art

As society has recently entered the information age, the field of displays for visually displaying electrical information signals has rapidly developed and, in order to satisfy such development, various display devices having excellent performance, such as slimness, light weight and low power consumption, have been developed and have rapidly replaced conventional cathode ray tubes (CRTs).

Thereamong, light emitting display devices, which do not require separate light sources, achieve compactness and clear color display and includes light emitting devices within a display panel, are considered as competitive applications.

When an optical compensation layer for compensating for an optical distance in each of subpixels configured to emit light with different colors is provided in an organic stack between an anode and a cathode, the optical compensation layer causes differences in thicknesses between the anode and the cathode, thereby increasing driving voltage.

Further, the optical compensation layer is required by a specific subpixel and thus a separate mask is required, thereby deteriorating process yield.

SUMMARY

Accordingly, the present disclosure is directed to a light emitting display device that substantially obviates one or more problems due to limitations and disadvantages of the related art.

An object of the present disclosure is to provide a light emitting display device in which an optical compensation layer for compensating for an optical distance in each of subpixels configured to emit light with different colors is provided together with formation of a thin film transistor array, so as to decrease a driving voltage value required to drive an organic stack and to improve processibility.

Another object of the present disclosure is to provide a light emitting display device in which an auxiliary optical compensation layer for compensating for differences in optical distances among subpixels is formed of a different material from an emission layer using the same mask as the emission layer, so as to realize additional fine optical distance adjustment required due to equipment differences.

Additional advantages, objects, and features of the disclosure will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a light emitting display device includes a substrate including first subpixels and second subpixels, a first reflective electrode and a second reflective electrode provided in the first subpixels and the second subpixels, a first optical compensation layer provided on the first reflective electrode, a first anode configured to contact the first optical compensation layer and a second anode configured to contact the second reflective electrode, a first unit configured to have at least one first stack including a first common layer, a first emission layer configured to emit light with a first wavelength, and a second common layer, which are sequentially stacked on the first anode, a second unit configured to have at least one second stack including the first common layer, a second emission layer configured to emit light with a second wavelength shorter than the first wavelength, and the second common layer, which are sequentially stacked on the second anode, and a cathode provided on the first and second units.

In another aspect of the present disclosure, a light emitting display device includes a substrate configured to have first to third subpixels, first to third reflective electrodes respectively provided in the first to third subpixels, a first optical compensation layer provided on the first reflective electrode, a second optical compensation layer provided on the third reflective electrode so as to have a thickness less than a thickness of the first optical compensation layer, a first anode configured to contact the first optical compensation layer, a second anode configured to contact the second reflective electrode, a third anode configured to contact the second optical compensation layer, a bank configured to overlap edges of the first to third anodes and to open first to third emission parts in the first to third subpixels, a first common layer provided on the first to third emission parts and the bank, first to third emission layers respectively provided in the first to third emission parts, a second common layer provided on the first to third emission layers, and a cathode provided on the second common layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION

Figure 1:
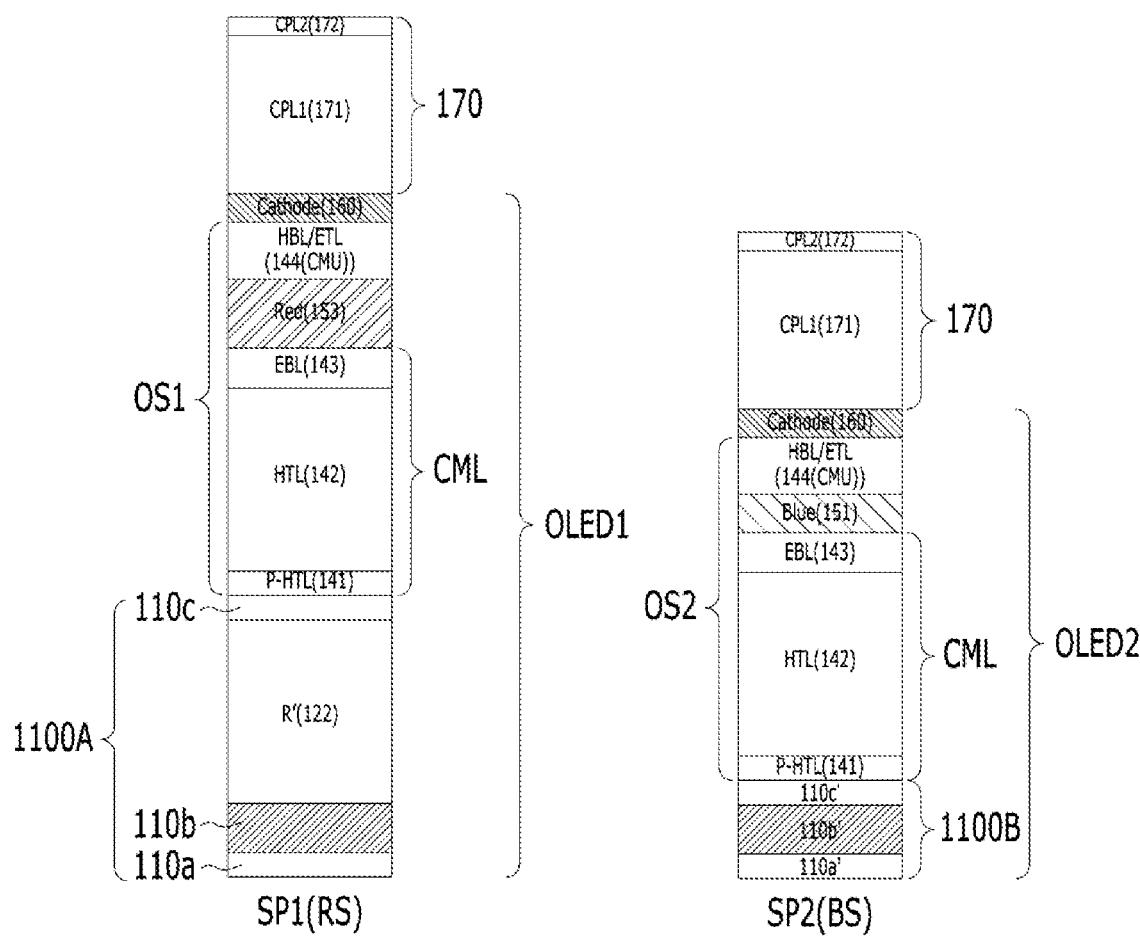
FIG. 1 is a cross-sectional view illustrating a light emitting display device according to a first embodiment of the present disclosure.

Reference will now be made in detail to the exemplary embodiments of the present invention, examples of which are illustrated in the accompanying drawings. In the following description of the embodiments and the drawings, the same or similar elements are denoted by the same reference numerals throughout the specification. In the following description of the embodiments of the present invention, a detailed description of known functions and configurations incorporated herein will be omitted when it may make the subject matter of the present invention rather unclear. Further, the names of elements used in the following description of the embodiments of the present invention are selected in consideration of ease of preparation of the specification, and may thus differ from the names of parts of an actual product.

The shapes, sizes, ratios, angles and numbers of elements given in the drawings to describe the embodiments of the present disclosure are merely exemplary, and thus, the present invention is not limited to the illustrated details. In the following description of the embodiments, the terms "including", "comprising" and "having" are to be interpreted as indicating the presence of one or more other characteristics, numbers, steps, operations, elements or parts stated in the specification or combinations thereof, and do not exclude the presence of other characteristics, numbers, steps, operations, elements, parts or combinations thereof, or the possibility of adding the same, unless the term "only" is used. It will be understood that a singular expression of an element(s) encompasses a plural expression unless stated otherwise.

In interpretation of elements included in the various embodiments of the present invention, it is to be interpreted that quantitative descriptions of characteristics of the elements include error ranges unless stated otherwise.

In the following description of the embodiments, it will be understood that, when positional relationships are expressed, for example, when an element is said to be "on", "above", "under" or "beside" another element, the two elements may directly contact each other, or one or more other elements may be interposed between the two elements, unless the term "just" or "directly" is used.

In the following description of the embodiments, it will be understood that, when temporal relationships are expressed, for example, when terms expressing a sequence of events, such as "after", "subsequent to", "next" and "before" are used, the terms encompass both a continuous relationship between the events and a discontinuous relationship between the events, unless the term "just" or "directly" is used.

In the following description of the embodiments, it will be understood that, when the terms "first", "second", etc. are used to describe various elements, these terms are used merely to distinguish the same or similar elements. Therefore, a first element described hereinafter could be termed a second element without departing from the technical scope of the disclosure.

Respective features of the various embodiments of the present disclosure may be partially or wholly coupled to or combined with each other and be interlocked or driven in various technical manners, and the respective embodiments may be implemented independently of each other or be implemented together through connection therebetween.

In the following description of the embodiments, the term "doped" means that the content of a material having properties different from a material occupying the majority of the weight of a corresponding layer (materials having different properties being, for example, an N-type material and a P-type material or an organic material and an inorganic material), which is added to the material occupying the majority of the weight of the corresponding layer, is less than 30 wt %. In other words, a "doped" layer means a layer in which a host material and a dopant material may be discriminated from each other based on a ratio of the weight percents thereof. In addition, the term "undoped" means all cases other than the case corresponding to the term "doped". For example, if a layer is formed of a single material or is formed of a mixture of materials having the same or similar properties, the layer may be an "undoped" layer. For example, if at least one of materials forming a layer is P-type and none of the materials forming the layer are N-type, the layer is an "undoped" layer. For example, if at least one of materials forming a layer is organic and none of the materials forming the layer are inorganic, the layer is an "undoped" layer. For example, if all of the materials forming a layer are organic and at least one of the materials forming the layer is N-type and at least another of the other materials is P-type, when the content of the N-type material is less than 30 wt % or the content of the P-type material is less than 30 wt %, the layer is a "doped" layer.

FIG. 1 is a cross-sectional view illustrating a light emitting display device according to a first embodiment of the present disclosure.

As shown in FIG. 1, the light emitting display device according to the first embodiment of the present disclosure includes a substrate (100 shown in FIG. 3) having first subpixels SP1 and second subpixels SP2, first reflective electrodes 110*b* and second reflective electrodes 110*b'* respectively provided in the first subpixel SP1 and the second subpixels SP2, a first optical compensation layer 122 provided on the first reflective electrodes 110*b*, first anodes 110*c* configured to contact the first optical compensation layer 122, and second anodes 110*c'* respectively configured to contact the second reflective electrodes 110*b'*.

Further, a first unit OS1, sequentially including a first common layer CML, a first emission layer 153 configured to emit light with a first wavelength, and a second common layer CMU (144), is provided on the first anode 110*c*.

A second unit OS2, sequentially including the first common layer CML, a second emission layer 151 configured to emit light with a second wavelength shorter than the first wavelength, and the second common layer CMU (144), is provided on the second anode 110*c'*.

The respective layers of the first unit OS1 and the second unit OS2 may be formed of organic materials, and may be formed through evaporation using the respective organic materials.

A cathode 160 is provided in common on the first unit OS1 and the second unit OS2. The cathode 160 may also be formed through evaporation in the same manner as the respective layers of the first and second units OS1 and OS2.

The first unit OS1 and the second unit OS2 include in common the first common layer CML and the second common layer CMU (144) except for the first and second emission layers 153 and 151. The first and second emission layers 153 and 151 are selectively provided in the corresponding subpixels, and may thus be formed using a fine metal mask (FMM).

The respective layers of the first and second common layers CML and CMU are provided on and under the first and second emission layers 153 and 151 throughout the subpixels, and may be formed using a common mask having openings corresponding to the respective subpixels.

Further, the first common layer CML relates to injection and transport of holes, and may include a hole injection layer 141, a hole transport layer 142 and an electron blocking layer 143.

The hole injection layer 141 is formed of a material which has a low energy barrier to the anodes 110*c* and 110*c'* and low surface resistance so that holes from the anodes 110*c* and 110*c* are easily injected into the hole injection layer 141, and for this purpose, the material of the hole injection layer 141 may include a p-type dopant in a hole transport material.

The hole transport layer 142 easily transmits holes supplied from the hole injection layer 141 to the emission layers 153 and 151, and is formed of a hole transport material.

The electron blocking layer 143 serves to prevent excitons formed by the emission layers 153 and 151 or electrons transmitted to the emission layers 153 and 151 from moving to the hole transport layer 142.

In some cases, the hole injection layer 141 and the electron blocking layer 143 may be omitted, or may be formed integrally with the hole transport layer 142.

The second common layer CMU (144) may include a hole blocking layer HBL configured to prevent holes from escaping from the emission layers 153 and 151, and an electron transport layer ETL configured to transport electrons. The hole blocking layer HBL and the electron transport layer ETL may be formed as different layers. They may be separately formed.

The first and second common layers CML and CMU may further include additional layers integrated therewith depending on performance requirements of the display device, and may include a host or a dopant component included in the emission layers 153 and 151.

The light emitting display device according to the present disclosure is structurally characterized in that the first optical compensation layer 122 is provided between the first reflective electrode 110*b* and the first anode 110*c* rather than in the organic unit OS1 between the first anode 110*c* and the cathode 160. That is, the first optical compensation layer 122 is provided between the first reflective electrode 110*b* and the first anode 110*c* before an organic material deposition process, and may thus be formed during a thin film transistor array formation process performed through photolithography before the organic material deposition process. Therefore, the light emitting display device according to the present disclosure does not separately require a fine metal mask and a chamber for forming the first optical compensation layer 122, compared to a structure in which an optical compensation layer is provided within an organic stack (a unit formed of organic components, and hereinafter, the first unit OS1 and the second unit OS2 may also be referred to as a first organic stack OS1 and a second organic stack OS2, respectively). Therefore, because only the emission layers 153 and 151 among the organic stacks OS1 and OS2 require a fine metal mask, use of fine metal masks is reduced and thus process yield may be improved, and an organic material used to form the optical compensation layer is omitted and thus use of organic materials may be reduced.

Hereinafter, the functions of the first optical compensation layer 122 will be described.

In the light emitting display device in which the respective subpixels emit light with different colors, light is resonated while repeating reflection and re-reflection between the reflective electrode 110*b* and the cathode 160 in each of the subpixels, and finally exits through the cathode 160. In this case, the optimal luminescent position varies depending on the colors of emitted light, and thus, in order to locate the emission layer at a position suitable for an optical distance configured to optimally emit light from the reflective electrode 110*b*, the first optical compensation layer 122 is provided. As the wavelength of emitted light increases, the optical distance increases, and thus the emission layer is located farther away from the reflective electrode 110*b*.

FIG. 1 illustrates an example in which the first subpixel SP1 is a red subpixel RS and the second subpixel SP2 is a blue subpixel BS. The first subpixel SP1 includes the first emission layer 153 configured to emit light with a long wavelength, and the second subpixel SP2 includes the second emission layer 151 configured to emit light with a short wavelength. No optical compensation layer is provided and the optical distance of the second emission layer 151 is maintained by only the first common layer CML on the second anode 110*c'* in the second subpixel SP2 configured to emit light with a relatively short wavelength, and the first optical compensation layer 122 is provided in the first subpixel SP1 configured to emit light with a relatively long wavelength so as to adjust the long optical distance of the first emission layer 153 from the first reflective electrode 110*b*. The first emission layer 153 may be a red emission layer, and the second emission layer 151 may be a blue emission layer. The red emission layer 153 may emit light with a wavelength range of 600 nm to 660 nm, and the blue emission layer 151 may emit light with a wavelength range of 430 nm to 495 nm.

In the first subpixel SP1, the first optical compensation layer 122 is located between the first reflective electrode 110*b* and the first anode 110*c*, and may be formed of a transparent inorganic insulating film, such as an oxide film, a nitride film, an oxynitride film or the like.

Transparent electrodes 110a and 110a' may be further provided under the first and second reflective electrodes 110b and 110b'. Thereby, interfacial adhesion between the first and second reflective electrodes 110b and 110b' and thin film transistors TFT provided therebelow may be increased, and contact resistance may be reduced.

The first and second reflective electrodes 110b and 110b' are formed of a reflective metal in order to increase reflection efficiency in the respective subpixels SP1 and SP2, and, for example, may be formed of a metal or a metal alloy, such as Ag, an Ag alloy, Al, an Al alloy, Ag—Pb—Cu (APC) or the like.

The first and second anodes 110c and 110c' may be transparent electrodes formed of the same material as the transparent electrodes 110a and 110a'. In order to facilitate transmission of light reflected by the first and second reflective electrode 110b and 110b' and to lower resistance on the interfaces between the first and second anodes 110c and 110c' and the organic units OS1 and OS2 formed of organic materials, the first and second anodes 110c and 110c' may be formed of a transparent oxide component including at least one of indium, tin and zinc.

Vertical structures from the transparent electrodes 110a and 110a' to the cathode 160 are referred to as light emitting devices OLED1 and OLED2 from an electrical point of view. Further, in the light emitting device OLED1 or OLED2, a three-layer structure including the transparent electrode 110a or 110a, the reflective electrode 110b or 110b' and the anode 110c or 110c', to which the same electric signal is applied, may be referred to as an anode stack 1100A or 1100B. In FIG. 1, the substrate 100 shown in FIG. 3 may be provided under the light emitting devices OLED1 and OLED2.

In the example shown in FIG. 1, the first subpixel SP1 may be configured such that, in order to exhibit optical characteristics, the first optical compensation layer 122 is provided between the first reflective electrode 110b and the first anode 110c in an emission part and thus a vertical gap is formed but, in order to realize electrical conduction, the first anode 110c and the first reflective electrode 110b or the first transparent electrode 110a extend towards one side from the optical compensation layer 122 in a non-emission part so as to be directly conductively connected. Alternatively, a contact hole (not shown) may be formed through the first optical compensation layer 122, and the first anode 110c may be directly connected to the first reflective electrode 110b by the contact hole.

A capping layer 170 may be provided on the cathode 160 in common throughout the respective subpixels. The capping layer 170 may be provided to increase the luminous efficacy of light emitted by the light emitting devices OLED1 and OLED2 and to protect the light emitting devices OLED1 and OLED2. The capping layer 170 may have a two-layer structure including an organic capping layer 171 and an inorganic capping layer 172 stacked on the organic capping layer 171, as shown in this figure, or an inverted structure of the two-layer structure, or may have an organic/inorganic composite film structure. The capping layer 170 may be formed as a single layer. The organic material composition of the capping layer 170 may be the same as the organic material composition in the first and second units OS1 and OS2.

Hereinafter, a light emitting display device according to a second embodiment of the present disclosure, which further includes green subpixels configured to emit light with a middle wavelength in addition to the red subpixels and the blue subpixels, will be described.

Figure 2:
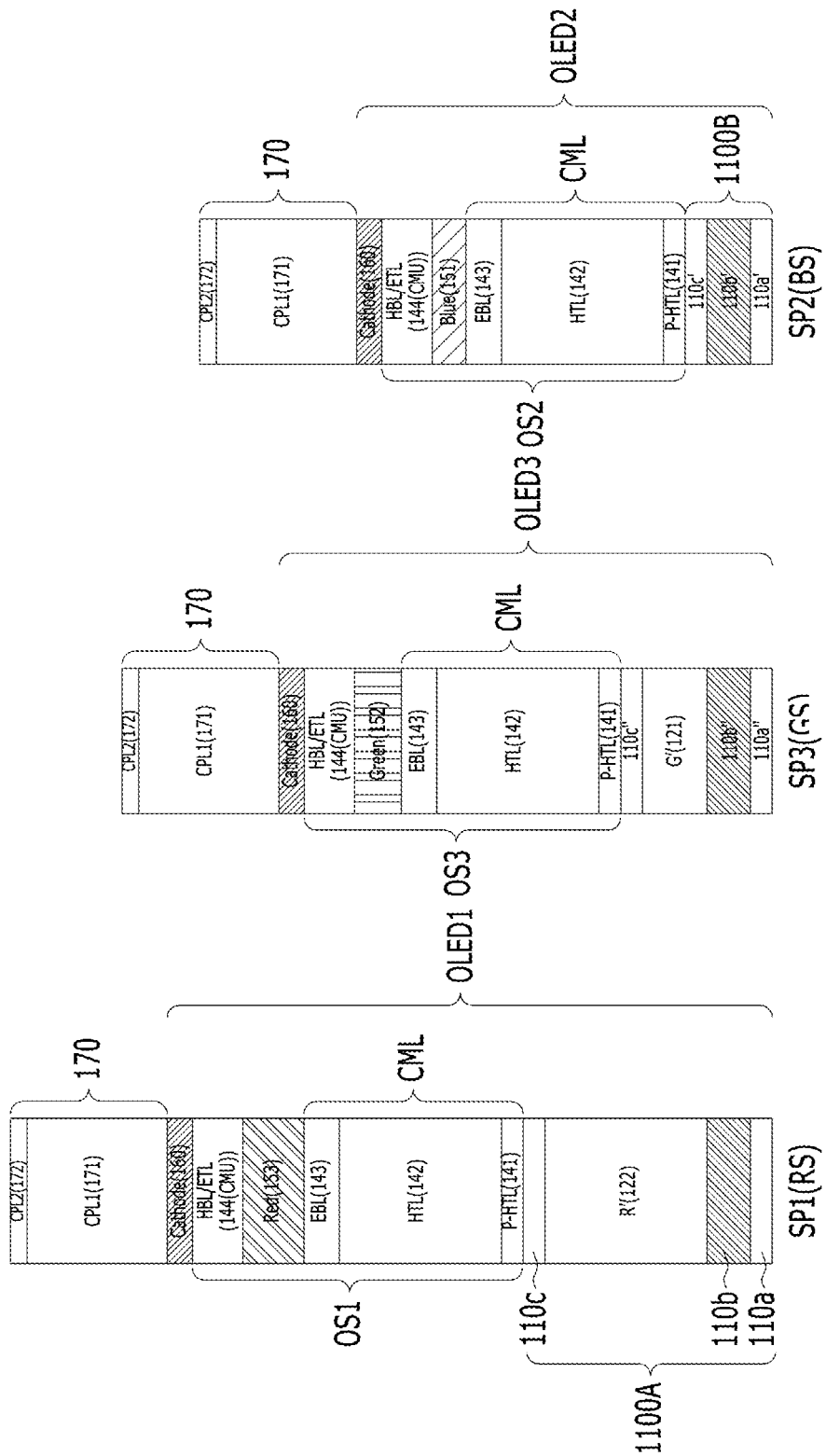
FIG. 2 is a cross-sectional view illustrating a light emitting display device according to a second embodiment of the present disclosure.
Figure 3:
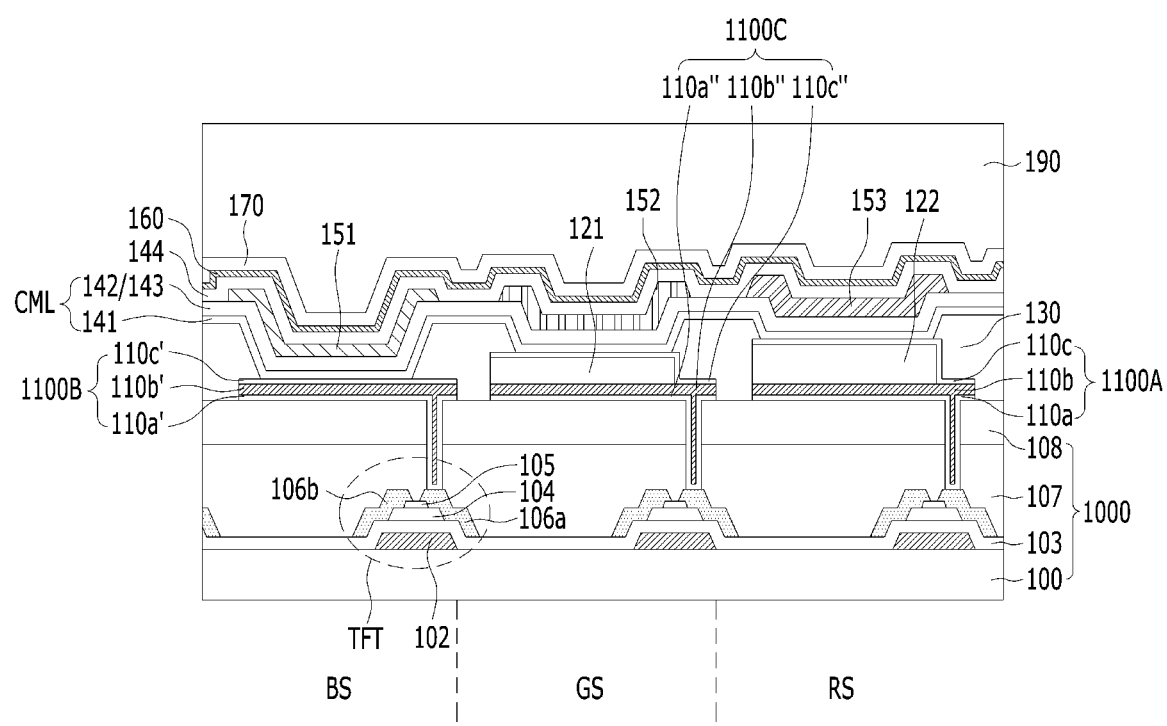
FIG. 3 is a detailed cross-sectional view illustrating one example of implementation of FIG. 2 according to one embodiment.

FIG. 2 is a cross-sectional view illustrating the light emitting display device according to the second embodiment of the present disclosure, and FIG. 3 is a detailed cross-sectional view illustrating one example of implementation of FIG. 2 according to one embodiment.

As shown in FIG. 2, the light emitting display device according to the second embodiment of the present disclosure further includes the green subpixels GS as third subpixels in addition to the red subpixels RS and the blue subpixels BS.

The green subpixel GS includes a third reflective electrode 110b'', a third anode 110c'' provided on the third reflective electrode 110b'', and a third unit OS3 (hereinafter, the third unit OS3 may also be referred to as a third organic stack OS3) including the first common layer CML, a third emission layer 152 configured to emit green or yellowish green light, which is light with a wavelength between red light and blue light, and the second common layer CMU: 144, on the third anode 110c''. Further, the cathode 160 may be provided on the third unit OS3.

Further, a second optical compensation layer 121 having a less thickness than that of the first optical compensation layer 122 may be provided between the third reflective electrode 110b'' and the third anode 110'', thereby enabling the third emission layer 152 to be located at the optimum luminescent position of the third unit OS3.

Because the optical distance of green light (or yellowish green light) is shorter than the optical distance of red light, the vertical distance from the third reflective electrode 110b'' to the third emission layer 152 may be shorter than the vertical distance from the above-described first reflective electrode 110b to the first emission layer 153.

The first and second optical compensation layers 122 and 121 may be formed to have different thicknesses using a halftone mask through the same process. The first and second optical compensation layers 122 and 121 may be formed of the same transparent inorganic insulating film.

In the second embodiment, because the organic stacks OS1, OS2 and OS3 of the respective subpixels RS, BS and GS include the same common layers CML and CMU except the corresponding emission layers 153, 151 and 152, thickness differences between the organic stacks OS1, OS2 and OS3 are caused only by thickness differences between the emission layers 153, 151 and 152. Particularly, in the second embodiment of the present disclosure, the first and second optical compensation layers 122 and 121 are provided between the first and third reflective electrodes 110b and 110b'' and the first and third anodes 110c and 110c'', the optical distances of light with the respective colors may be compensated for without great thickness differences among the organic stacks OS1, OS2 and OS3, and thus, the organic stacks OS1 and OS3 do not need to increase the thicknesses thereof in the first and third subpixels SP1 and SP3 (red and green subpixels RS and GS) having the first and second optical compensation layers 122 and 121. Therefore, driving voltage taken to drive the organic stacks OS1 and OS3 between the anodes 110c and 110c'' and the cathode 160 may be reduced. Further, because the first and second optical compensation layers 122 and 121, which are formed to have thicknesses of about 200 Å to 1000 Å and are provided between the first and third reflective electrodes 110b and 110b'' and the first and third anodes 110c and 110c'', may be formed of an inorganic material so as not to be sensitive to temperature, this structure having the first and second optical compensation layers 122 and 121 may have a high film density and high film stability, compared to a structure in which an optical compensation layer is provided within an organic unit.

Referring to FIG. 3, the configuration of the light emitting display device according to the present disclosure will be described below.

The configuration of a thin film transistor TFT connected to each of the first to third transparent electrodes 110*a*, 110*a*' and 110*a*", which are the lower electrodes of the anode stacks 1100A, 1100B and 1100C of the first to third subpixels SP1, SP2 and SP3 (red, blue and green subpixels RS, BS and GS), will be described.

An assembly of the substrate 100 and a thin film transistor array formed on the substrate 100 may be referred to as a thin film transistor substrate 1000.

Each of the subpixels RS, BS and GS may include at least one thin film transistor TFT, and the thin film transistor TFT may include a gate electrode 102, an active layer 104 configured to overlap the gate electrode 102, and a source electrode 106*a* and a drain electrode 106*b* connected to both sides of the active layer 104.

A channel protective layer 105 may be further provided on a channel of the active layer 104 so as to protect the channel. A gate insulating film 103 may be further provided between the gate electrode 102 and the active layer 104.

The active layer 104 may include at least one of an oxide semiconductor layer, a polysilicon layer and an amorphous silicon layer.

Further, the thin film transistor array substrate 1000 may include a first protective film 107 and a second protective film 108 so as to protect the thin film transistors TFT. One of the first and second protective films 107 and 108 may be an inorganic protective film, and the other may be an organic protective film.

The source electrode 106*a* may be connected to each of the anode stacks 1100A, 1100B and 1100C of the light emitting devices OLED1, OLED2 and OLED3 through a contact hole CT formed through the first and second protective films 107 and 108 so as to expose a part of the source electrode 106*a*. The three electrodes, i.e., the transparent electrode 110*a*, 110*a*' or 110*a*", the reflective electrode 110*b*, 110*b*' or 110*b*" and the anode 110*c*, 110*c*' or 110*c*", of each of the anode stacks 1100A, 1100B and 1100C having the three-layer structure may be conductively connected. However, there is a difference between the layer structures of the first and third subpixels SP1, SP3 (red and green subpixels RS and GS), having the optical compensation layers 122 and 121 between the reflective electrodes 110*b* and 110*b*" and the anodes 110*c* and 110*c*", and the layer structure of the second subpixel SP2 (blue subpixel BS), having no optical compensation layer.

The edge of each of the anode stacks 1100A, 1100B and 1100C overlaps with a bank 130, and a portion of each of the anode stacks 1100A, 1100B and 1100C, which is exposed from the bank 130 is defined as an emission part. A portion of each of the subpixels RS, GS and BS at which the bank 130 is located is defined as a non-emission part.

In the second subpixel SP2 (blue subpixel BS) having no optical compensation layer, the second transparent electrode 110*a*', the second reflective electrode 110*b*' and the second anode 110*c*' are sequentially stacked to form the second anode stack 1100B, and these layers formed of electrode components are directly conductively connected. The second transparent electrode 110*a*' and/or the second reflective electrode 110*b*' may be connected to the source electrode 106*a* of the thin film transistor TFT provided thereunder.

In the first subpixel SP1 (red subpixel RS), particularly in the emission part exposed from the bank 130, the first transparent electrode 110*a*, the first reflective electrode 110*b*, the first optical compensation layer 122 and the first anode 110*c* are sequentially stacked. Therefore, the first optical compensation layer 122 serves to increase an optical distance from the upper surface of the first reflective electrode 110*b*. Further, in the portion of the first subpixel SP1 (red subpixel RS) overlapping the bank 130, i.e., the non-emission part, the first anode 110*c* may be connected to the exposed part of the first reflective electrode 110*b* provided thereunder along the side part of the first optical compensation layer 122, and an electrical common signal may be applied to the first transparent electrode 110*a*, the first reflective electrode 110*b* and the first anode 110*c*. Further, in the non-emission part, the first transparent electrode 110*a* and/or the first reflective electrode 110*b* may be connected to the source electrode 106*a* of the thin film transistor TFT provided thereunder.

Similarly, in the third subpixel SP3 (green subpixel GS), particularly in the emission part exposed from the bank 130, the third transparent electrode 110*a*", the third reflective electrode 110*b*", the second optical compensation layer 121 and the third anode 110*c*" are sequentially stacked. Therefore, the second optical compensation layer 121 serves to increase an optical distance from the upper surface of the third reflective electrode 110*b*". The third subpixel SP3 (green subpixel GS) emits light with a shorter wavelength than that of light emitted by the first subpixel SP1 (red subpixel RS) and may thus require a shorter optical distance than the first subpixel SP1 (red subpixel RS), and thereby, the thickness of the second optical compensation layer 121 may be less than the thickness of the first optical compensation layer 122.

Also in the part of the third subpixel SP3 (green subpixel GS) overlapping the bank 130, i.e., the non-emission part, the third anode 110*c*" may be connected to the exposed part of the third reflective electrode 110*b*" provided thereunder along the side part of the second optical compensation layer 121, and an electrical common signal may be applied to the third transparent electrode 110*a*", the third reflective electrode 110*b*" and the third anode 110*c*". Further, in the non-emission part, the third transparent electrode 110*a*" and/or the third reflective electrode 110*b*" may be connected to the source electrode 106*a* of the thin film transistor TFT provided thereunder.

A capping layer 170 may be provided on the cathode 160 so as to increase the luminous efficacy of light emitted by the light emitting devices OLED1, OLED2 and OLED3 and to protect the light emitting devices OLED1, OLED2 and OLED3. Further, an encapsulation layer 190 may be further provided on the capping layer 170 so as to prevent moisture from flowing into the light emitting devices OLED1, OLED2 and OLED3 and to prevent influence from ambient air. In addition to the encapsulation layer 190, a color filter layer, a polarization layer or other optical films may be additionally provided. Further, the encapsulation layer 190 may be provided as an encapsulation film structure in which an organic film and an inorganic film are alternately stacked, or an encapsulation substrate and an adhesive layer provided between an array including the light emitting devices OLED1, OLED2 and OLED3 and the encapsulation substrate may be further provided.

Hereinafter, a light emitting display device according to another embodiment of the present invention, which further includes an auxiliary optical compensation layer within an organic stack provided between an anode and a cathode, will be described.

Figure 4:
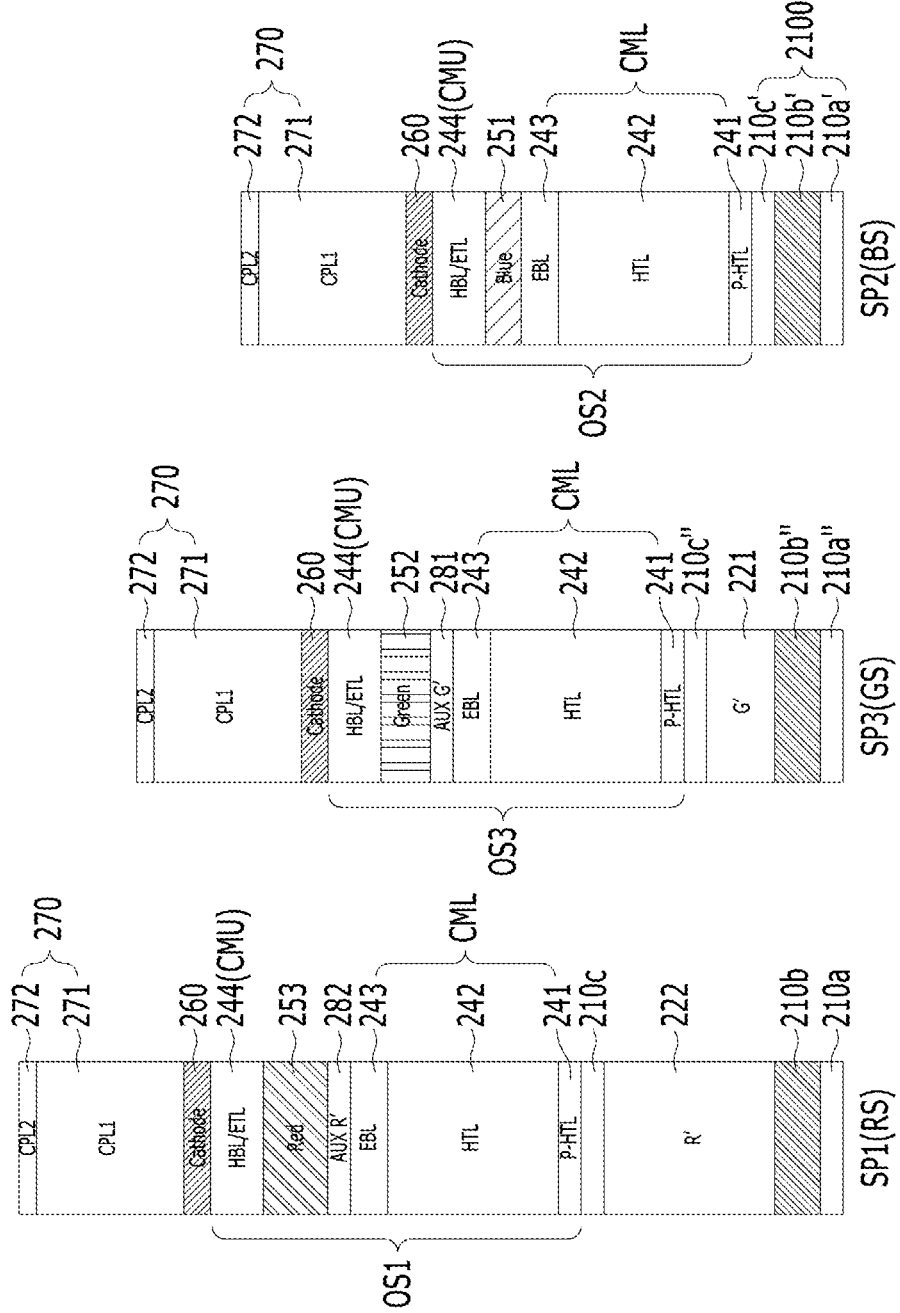
FIG. 4 is a cross-sectional view illustrating a light emitting display device according to a third embodiment of the present disclosure.
Figure 5:
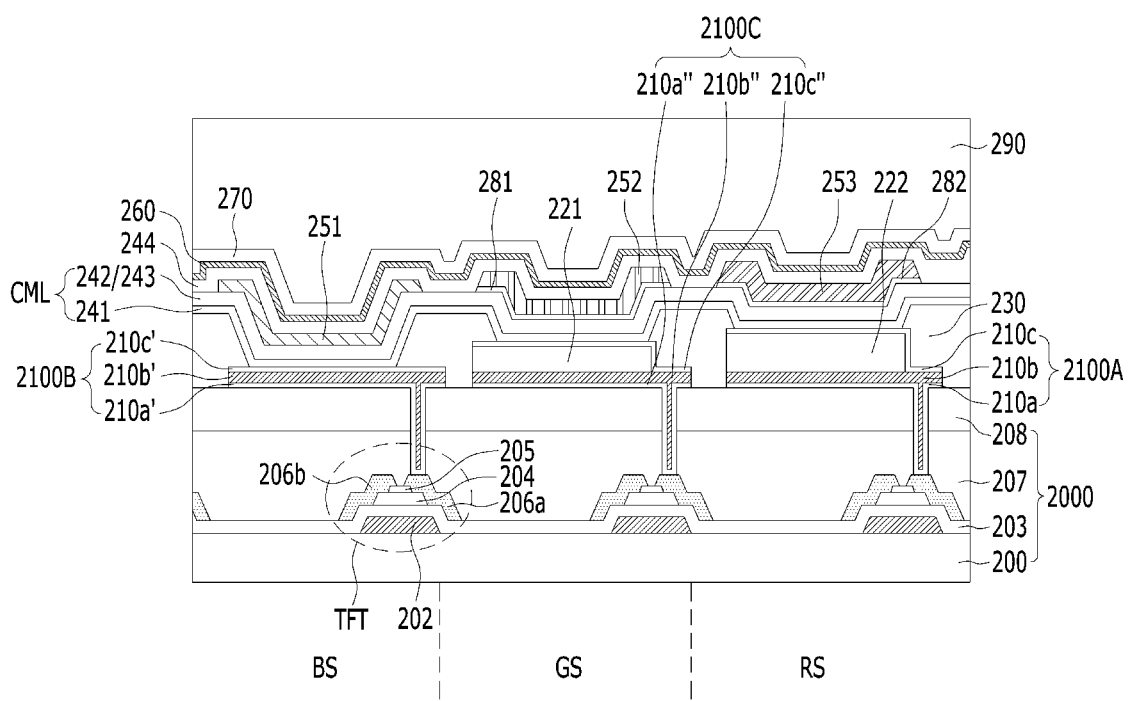
FIG. 5 is a detailed cross-sectional view illustrating one example of implementation of FIG. 4 according to one embodiment.

FIG. 4 is a cross-sectional view illustrating a light emitting display device according to a third embodiment of the present disclosure, and FIG. 5 is a detailed cross-sectional view illustrating one example of implementation of FIG. 4 according to one embodiment.

In a light emitting display device, because a plurality of organic films other than a single organic film are stacked on an anode and respective subpixels have different emission layers, the subpixels exhibit different distribution characteristics and thus compensation therefor is required.

Because the above-described optical compensation layers are formed before formation of the anodes 110c, 110c', and 110c" and the anodes 110c, 110c', and 110c" are positioned before organic layers, it is difficult to substantially use the optical compensation layers as a compensation means in an organic deposition process.

Hereinafter, in addition to the optical compensation layers which are located between the reflective electrodes and the anodes so as to adjust the optical distance, an auxiliary optical compensation layer configured to finely adjust process distribution differences in a chamber will be described.

As shown in FIGS. 4 and 5, the light emitting display device according to the third embodiment of the present disclosure includes a substrate 200 having first subpixels RS, second subpixels BS and third subpixels GS, first to third reflective electrodes 210b, 210b' and 210b" respectively provided in the first to third subpixels RS, BS and GS, a first optical compensation layer 222 provided on the first reflective electrode 210b, a second optical compensation layer 221 provided on the third reflective electrode 210b", a first anode 210c configured to contact the upper surface of the first optical compensation layer 222, a second anode 210c' configured to contact the upper surface of the second reflective electrode 210b', and a third anode 210c" configured to contact the upper surface of the second optical compensation layer 221. Further, the light emitting display device according to the third embodiment of the present invention is characterized in that first and second auxiliary optical compensation layers 282 and 281 (In the drawings, they are described as "AUX R'" and "AUX G'") are provided in organic stacks OS1 and OS3 of the respective first and third subpixels RS and GS.

The first and second auxiliary optical compensation layers 282 and 281 according to the present disclosure are provided when it is necessary to adjust the thicknesses of the organic stacks OS1, OS2 and OS3 depending on differences in equipment or process distribution. Thicknesses of the organic stacks required for compensation are calculated respectively prior to a process in the chamber, and then the first and second auxiliary optical compensation layers 282 and 281 are formed. Therefore, the first and second auxiliary optical compensation layers 282 and 281 are very thin so as to achieve fine compensation, and the respective thicknesses of the first and second auxiliary optical compensation layers 282 and 281 are less than the thicknesses of corresponding emission layers 253 and 252 adjacent thereto and are less than or equal to 0.22 times the thickness of the first optical compensation layer 222. Further, because the first and second auxiliary optical compensation layers 282 and 281 are very small thicknesses compared to the first optical compensation layer 222, increases in the thicknesses of the organic stacks OS1, OS2 and OS3 are small, and thus, a change in driving voltage is not great compared to the first and second embodiments.

Each of the first and second auxiliary optical compensation layers 282 and 281 may be formed in the same chamber for forming a corresponding one of the first emission layer 253 and the second emission layer 252, the first auxiliary optical compensation layer 282 may be formed as the same host as that of the first emission layer 253, and the second auxiliary optical compensation layer 281 may be formed as the same host as that of the third emission layer 252. In some cases, the first and second auxiliary optical compensation layers 282 and 281 may be formed of a hole transport material, a receiving part may be provided to selectively supply the hole transport material to the inside of the chamber for forming the emission layer, and the hole transport material in the receiving part may be supplied to the first and third subpixels RS and GS on the substrate 200 before the formation of the first and second emission layers 253 and 252.

Now, the structure of the first subpixel RS will be descried in detail.

The first reflective electrode 210b may be provided on the first transparent electrode 210a so as to reduce interfacial resistance when the first transparent electrode 210a is connected to a thin film transistor TFT provided thereunder, and the first optical compensation layer 222 may be provided on the first reflective electrode 210b so as to adjust an optical distance of light with a long wavelength in the first subpixel RS. Further, the first anode 210c may be provided on the first optical compensation layer 222. A first anode stack 2100A may be formed by conductively connecting the first transparent electrode 210a, the first reflective electrode 210b and the first anode 210c, which are sequentially stacked, in the non-emission part of the first subpixel RS.

Further, the first organic stack OS1 including a first common layer CML, the first auxiliary optical compensation layer 282, the first emission layer 253 configured to emit light with a first wavelength, and a second common layer CMU (244), which are sequentially stacked on the first anode 210c, is provided. Further, a cathode 260 and a capping layer 270 may be further stacked on the first organic stack OS1. The capping layer 270 may have a stack structure including a first capping layer 271 and a second capping layer 272 having different refractive indexes.

Further, the first common layer CML may include a hole injection layer 241, a hole transport layer 242 and an electron blocking layer 243, which relate to injection and transport of holes.

The hole injection layer 241 is formed of a material which has a low energy barrier to the first anode 210 and low surface resistance so that holes from the anode 210 are easily injected into the hole injection layer 241, and for this purpose, the material of the hole injection layer 241 may include a p-type dopant in a hole transport material.

The hole transport layer 242 easily transmits holes supplied from the hole injection layer 241 to the first emission layer 253, and is formed of a hole transport material.

The electron blocking layer 243 serves to prevent excitons formed by the first emission layer 253 or electrons transmitted to the first emission layer 253 from being transmitted to the hole transport layer 242.

In some cases, the hole injection layer 241 and the electron blocking layer 243 may be omitted, or may be formed integrally with the hole transport layer 242.

The second common layer CMU (244) may include a hole blocking layer HBL configured to prevent holes from escaping from the first emission layer 253, and an electron transport layer ETL configured to transport electrons. The hole blocking layer HBL and the electron transport layer ETL may be formed as different layers. They may be separately formed.

The first and second common layers 244 (CML and CMU) may further include additional layers integrated therewith depending on performance requirements of the display device, and may include a host or a dopant component included in the first emission layer 253.

In the first to third subpixels RS, BS and GS, among the structures provided on the first to third anodes 210c, 210c' and 210c", the above-described first common layer CML, second common layer CMU 144, cathode 260 and capping layer 270 are the same in the first to third subpixels RS, BS and GS. They may be formed using a common mask without using a fine metal mask, and are provided in common in all the subpixels RS, BS and GS. That is, the first common layer CML, the second common layer CMU 144, the cathode 260 and the capping layer 270 may be provided integrally without separation even in the non-emission part on the bank 230.

The second subpixel BS differs from the first subpixel RS in that no optical compensation layer is provided under the second anode 210c' and no auxiliary optical compensation layer is provided in the second organic stack OS2. Because the second subpixel BS has no optical compensation layer and no auxiliary optical compensation layer, the distance from the second reflective electrode 210b' to the second emission layer 251 is shorter than the distance in the first subpixel RS.

Further, the third subpixel GS differs from the first subpixel RS in that the second optical compensation layer 221 having a less thickness than the thickness of the first optical compensation layer 222 is provided under the third anode 210c" and the second auxiliary optical compensation layer 281 is provided in the third organic stack OS3.

Each of the respective emission layers 253, 251 and 252 includes a host and a dopant. Each of the respective emission layers 253, 251 and 252 includes the dopant so as to emit light with a certain color, and includes the host so as to assist in excitation of the dopant. Because the dopants of the respective emission layers 253, 251 and 252 are different, the hosts also configured to assist in excitation of the dopants may be different depending on the colors of light emitted by the emission layers 253, 251 and 252. Therefore, the first and second auxiliary optical compensation layers 282 and 281 formed of the same hosts as in the adjacent emission layers 253 and 252 may be formed of different materials in different processes.

The third subpixel GS has the second optical compensation layer 221 having thickness that is less than the thickness of the first optical compensation layer 222, and the distance from the third reflective electrode 210b" to the third emission layer 252 is shorter that the distance in the first subpixel RS.

Referring to FIG. 5, a thin film transistor array substrate 2000 according to the third embodiment of the present disclosure will be briefly described.

In the thin film transistor array substrate 2000, each of the subpixels RS, BS and GS may include at least one thin film transistor TFT, and the thin film transistor TFT may include a gate electrode 202, an active layer 204 configured to overlap the gate electrode 202, and a source electrode 206a and a drain electrode 206b connected to both sides of the active layer 204.

A channel protective layer 205 may be further provided on a channel of the active layer 204 so as to protect the channel. A gate insulating film 203 may be further provided between the gate electrode 202 and the active layer 204.

The active layer 204 may include at least one of an oxide semiconductor layer, a polysilicon layer and an amorphous silicon layer.

Further, the thin film transistor array substrate 2000 may include a first protective film 207 and a second protective film 208 so as to protect the thin film transistors. The TFT may be connected to each of the first to third anode stacks 2100A, 2100B and 2100C of the respective light emitting devices through a contact hole formed through the first and second protective films 207 and 208 so as to expose a portion of the source electrode 206a.

The bank 230 may be provided so as to open the emission parts of the respective subpixels RS, BS and GS, and may overlap the edges of the first to third stacks 2100A, 2100B and 2100C.

As described above, the first organic stack OS1 including the first auxiliary optical compensation layer 282 and the first emission layer 253, the second organic stack OS2 having the second emission layer 251, and the third organic stack OS3 including the second auxiliary optical compensation layer 281 and the third emission layer 252 are provided on the first to third anode stacks 2100A, 2100B and 2100C.

The first to third optical stacks OS1, OS2 and OS3 include in common the first common layer CML on the first to third anodes 210c, 210c' and 210c" of the respective anode stacks 2100A, 2100B and 2100C, and the first and third organic stacks OS1 and OS3 in the first subpixel RS and the third subpixel GS include the first and third emission layers 253 and 252 configured to contact the first and second auxiliary optical compensation layers 282 and 281 on the first common layer CML. In the second subpixel BS, the second emission layer 251 is provided directly on the first common layer CML. The second common layer CMU is provided on the respective emission layers 253, 252 and 251.

The cathode 260 and the capping layer 270 are sequentially provided on the respective organic stacks OS1, OS2 and OS3.

Further, an encapsulation layer 290 may be further provided on the capping layer 270 so as to prevent moisture from flowing into the light emitting devices and to prevent influence from ambient air.

Hereinafter, examples, in which a structure including a plurality of stacks is applied to each subpixel, will be described.

FIGS. 6 to 11 are cross-sectional views illustrating light emitting display devices according to fourth to ninth embodiments of the present invention.

Figure 6:
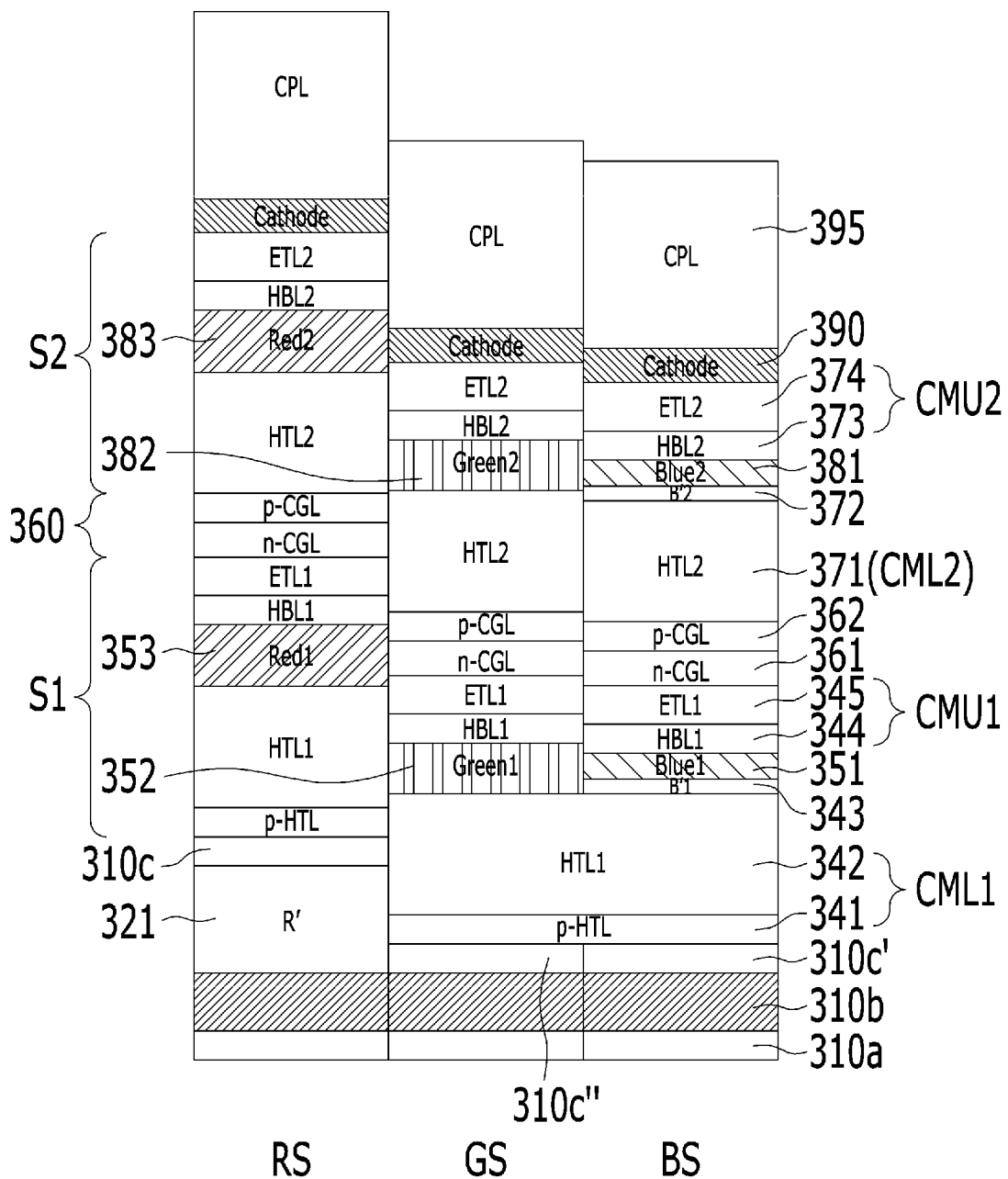
FIG. 6 is a cross-sectional view illustrating a light emitting display device according to a fourth embodiment of the present disclosure.

As shown in FIG. 6, a light emitting display device according to the fourth embodiment of the present disclosure includes first and second stacks S1 and S2 provided with a charge generation layer 360 interposed therebetween, on anodes 310c, 310c' and 310c" in respective subpixels RS, BS and GS. Further, the light emitting display device according to the fourth embodiment of the present disclosure has a structure in which an optical compensation layer 321 is provided between a reflective electrode 310b and the anode 310c in the first subpixel RX requiring the longest optical distance. A transparent electrode 310a may be provided under the reflective electrode 310b.

In the fourth embodiment shown in this figure, the optical compensation layer 321 is provided only in the first subpixel RS, and the second and third subpixels BS and GS have in common a three-layer structure including a transparent electrode 310a, the reflective electrode 310b, and a corresponding one of the anodes 310c' and 310c".

The charge generation layer 360 may include, for example, an n-type charge generation layer 361 configured to contribute to electron generation and to assist in electron transport from the lower stack, and a p-type charge generation layer 362 configured to contribute to hole generation and to assist in hole transport to the upper stack. The charge generation layer 360 may be formed in a structure including a plurality of layers, or may be formed in a single layer including an n-type dopant and a p-type dopant in a host material.

The first stack S1 may include a first common layer CML1, an emission layer 353, 351 or 352, and a second common layer CMU1.

The first common layer CML1 may include a hole injection layer 341 and a first hole transport layer 342, in the same manner as the first common layer CML shown in FIG. 1.

As shown in this figure, a first electron blocking layer 343 may be further provided in the second subpixel BS. In this case, the first electron blocking layer 343 may be formed of a material different from the material of the second emission layer 351 together with formation of the second emission layer 351 of the first stack S1 through the same fine metal mask (FMM) process for forming the second emission layer 351. In the shown structure having a plurality of stacks S1 and S2, the optical compensation layer 321 under the anode 310c may adjust an optical distance in the first subpixel RS, which emits light with the longest wavelength, and thus adjust a difference in optical distances between the first subpixel RS and the third subpixel GS, which emits light with a middle wavelength. In this structure, the third subpixel GS has no optical compensation layer, and in order to adjust a difference in optical distances between the third subpixel GS and the second subpixel BS, which emits light with a short wavelength, the optical distance in the second subpixel BS is adjusted by reducing the thickness of the second emission layer 351 to be less than those of other subpixels RS and GS.

In this case, during driving of a corresponding light emitting device, excitons or electrons generated from the second emission layer 351 having a small thickness easily escape towards the first common layer CML1 provided thereunder, compared to the first emission layer 353 or the third emission layer 352 having a relatively large thickness, and in order to prevent this problem, the light emitting display device according to the fourth embodiment of the present invention further includes the first electron blocking layer 343 provided under the second emission layer 351.

The second common layer CMU1 provided on each of the emission layers 353, 351 and 352 in the respective first stacks S1 may include a first hole blocking layer 344 and a first electron transport layer 345.

The second stack S2 may include a third common layer CML2, an emission layer 383, 381 or 382, and a fourth common layer CMU2, on the charge generation layer 360 in a corresponding one of the respective subpixels RS, BS and GS.

The third common layer CML2 may include a second hole transport layer 371.

In the same manner as the above-described first stack S1, a second electron blocking layer 372 may be further provided in the second stack S2 in the second subpixel BS. In this case, in order to prevent excitons or electrons generated from the second emission layer 381 of the first stack S2 from easily escaping towards the third common layer CML2 provided thereunder due to the small thickness of the second emission layer 381, the second electron blocking layer 372 is further provided under the second emission layer 381 having the small thickness of the second stack S2.

The fourth common layer CMU2 provided on each of the emission layers 383, 381 and 382 in the respective second stacks S2 may include a second hole blocking layer 373 and a second electron transport layer 374.

A cathode 390 and a capping layer 395 may be sequentially provided on the second stack S2.

Although the illustrated example shows the two-stack structure, the disclosure is not limited thereto, and an example, in which another charge generation layer is provided on the second stack S2 and an additional stack having the structure of the second stack is additionally provided on the charge generation layer, is possible. That is, a structure including three or more stacks and a charge generation layer provided between the respective stacks may be implemented.

The structure having a plurality of stacks improves luminous efficiency of each of colors of light emitted from the respective subpixels, thereby being capable of implementing clear colors and high efficiency.

Figure 7:
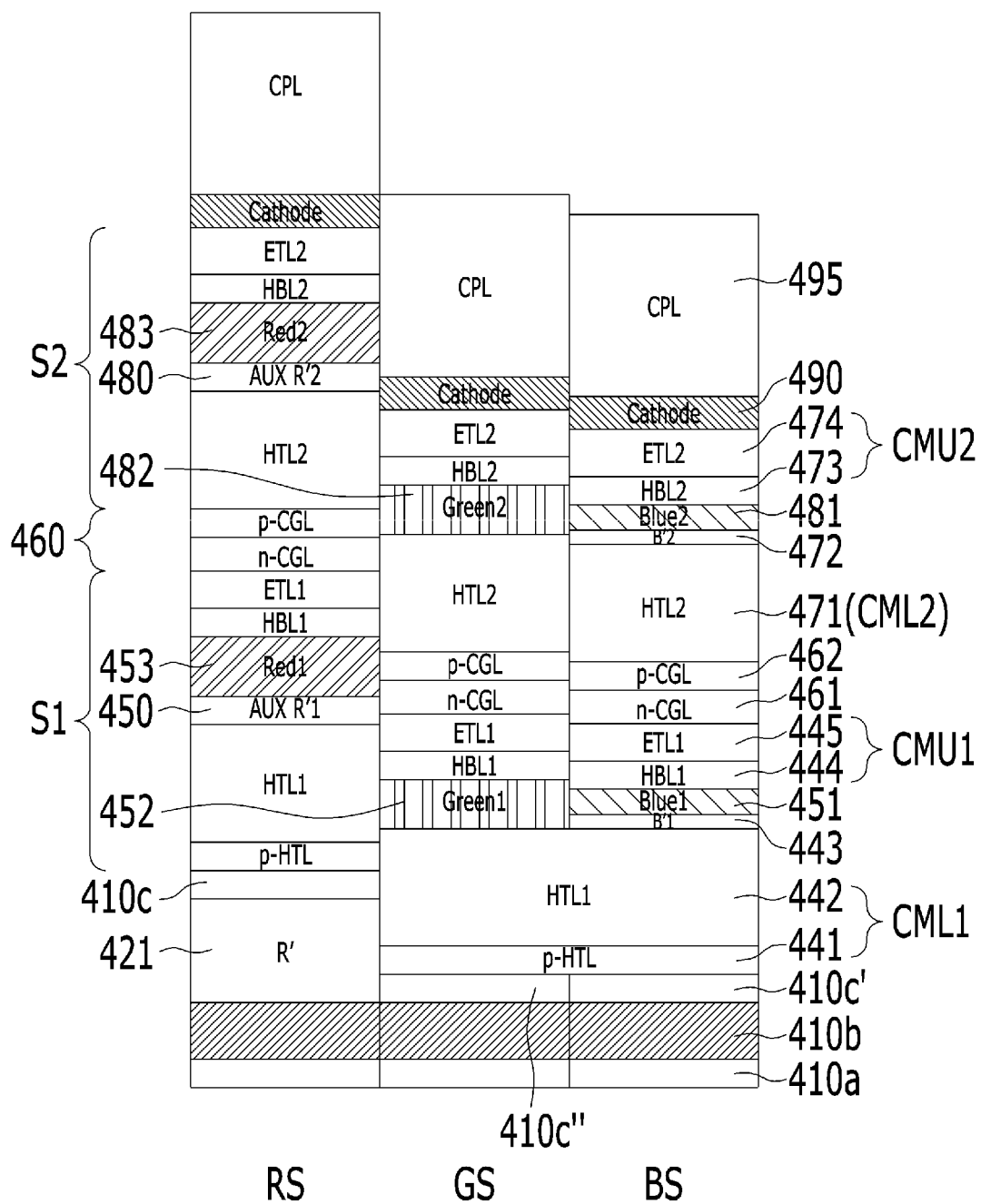
FIG. 7 is a cross-sectional view illustrating a light emitting display device according to a fifth embodiment of the present disclosure.

As shown in FIG. 7, a light emitting display device according to the fifth embodiment of the present disclosure is the same as the light emitting display device according to the fourth embodiment in that each of subpixels RS, BS and GS has a structure including a plurality of stacks and an optical compensation layer 421 is provided between a reflective electrode 410b and an anode 410c in the first subpixel RS, but differs from the light emitting display device according to the fourth embodiment in that first and second auxiliary optical compensation layers 450 and 480 (In the drawings, they are also described as "AUX R'1" and "AUX R'2") are additionally provided in first and second stacks S1 and S2 of the first subpixel RS.

Because the light emitting display device according to the fifth embodiment differs from the light emitting display device according to the fourth embodiment in terms of the stack structure in the first subpixel RS, the configuration of the first subpixel RS will be described below.

In the first subpixel RS, the optical compensation layer 421 may be provided between the reflective electrode 410b and the anode 410c, and thereby, the positions of first and second red emission layers 453 and 483 of the first and second stacks S1 and S2 may be adjusted upwards. A transparent electrode 410 is provided under the reflective electrode 410b, and the second subpixel BS and the third subpixel GS may have in common a structure in which the transparent electrode 410a, the reflective electrode 410b, and a corresponding one of anodes 410c' and 410c" are stacked.

In the first subpixel RS, the first stack S1 may include a first common layer CML1, the first auxiliary optical compensation layer 450, the first red emission layer 453 and a second common layer CMU1.

The first common layer CML1 may include a hole injection layer 441 and a first hole transport layer 442, in the same manner as the first common layer CML shown in FIG. 1.

The first auxiliary optical compensation layer 450 is provided so as to compensate for fine distribution deviations among equipment and the subpixels during a process for stacking organic layers after formation of the anode 410c, and is formed to have a thickness less than the thickness of the optical compensation layer 421 configured to mainly adjust an optical distance. The thickness of the first auxiliary optical compensation layer 450 is less than or equal to 0.22 times the thickness of the optical compensation layer 421, and particularly, may be selected from a range within which distribution characteristics may be compensated for without increasing driving voltage. The first auxiliary optical compensation layer 450 may be formed using the same mask in the same chamber as the first red emission layer 453, and may be formed of the same material as a red host for forming the first red emission layer 453. That is, prior to formation of the first red emission layer 453, the first auxiliary optical compensation layer 450 is formed by depositing a red host material to a small thickness.

The first common layer CML1 of the first stack S1 is provided in common in the first subpixel RS and the second and third subpixels BS and GS.

As shown in this figure, a first electron blocking layer 443 may be further provided in the second subpixel BS. The first electron blocking layer 443 is the same as the above-described first electron blocking layer 343, and thus a detailed description thereof will be omitted.

Further, the second common layer CMU1 is provided on each of the first red emission layer 453, the first blue emission layer 451 and the first green emission layer 452 of the respective first stacks S1. The second common layer CMU1 may include a first hole blocking layer 444 and a first electron transport layer 445.

The charge generation layer 460 may include, for example, an n-type charge generation layer 461 configured to contribute to electron generation and to assist in electron transport from the lower stack, and a p-type charge generation layer 462 configured to contribute to hole generation and to assist in hole transport to the upper stack.

The second stack S2 may include a third common layer CML2, an emission layer 483, 481 or 482, and a fourth common layer CMU2, on the charge generation layer 460 in a corresponding one of the respective subpixels RS, BS and GS.

The third common layer CML2 may include a second hole transport layer 471, and the fourth common layer CMU2 may include a second hole blocking layer 473 and a second electron transport layer 474.

Further, as described above, the second auxiliary optical compensation layer 480 may be further provided between the third common layer CML2 and the second red emission layer 483 of the second stack S2 in the first subpixel RS, and a second electron blocking layer 472 may be further provided between the third common layer CML2 and the second blue emission layer 481 of the second stack S2 in the second subpixel BS.

The light emitting display device according to the fifth embodiment further includes the auxiliary optical compensation layers 450 and 480 in the organic stacks S1 and S2 in the subpixel having the optical compensation layer 421, compared to the light emitting display device according to the fourth embodiment, thereby being capable of adjusting fine distribution deviations among equipment and the subpixels.

A cathode 490 and a capping layer 495 may be sequentially provided on the second stack S2.

Figure 8:
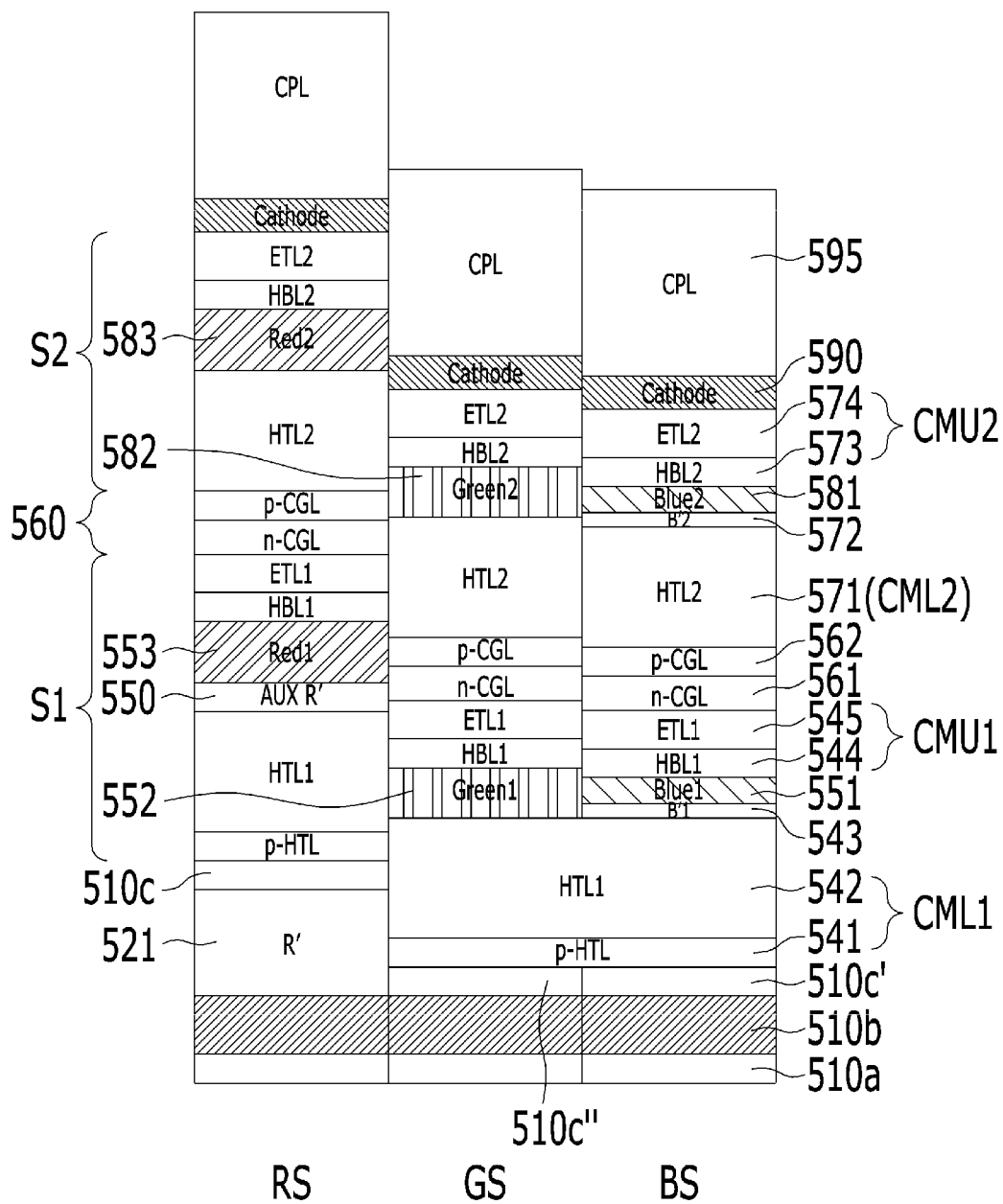
FIG. 8 is a cross-sectional view illustrating a light emitting display device according to a sixth embodiment of the present disclosure.

A light emitting display device according to the sixth embodiment of the present disclosure shown in FIG. 8 differs from the light emitting display device according to the fifth embodiment in that an auxiliary optical compensation layer 550 is provided only in a first stack S1 of a first subpixel RS. The auxiliary optical compensation layer 550 is provided on a first common layer CML1 in the first stack S1, and thereafter, a first red emission layer 553 is formed thereon. Further, in the first subpixel RS, an optical compensation layer 521 is provided between a reflective electrode 510b and an anode 510c.

Figure 9:
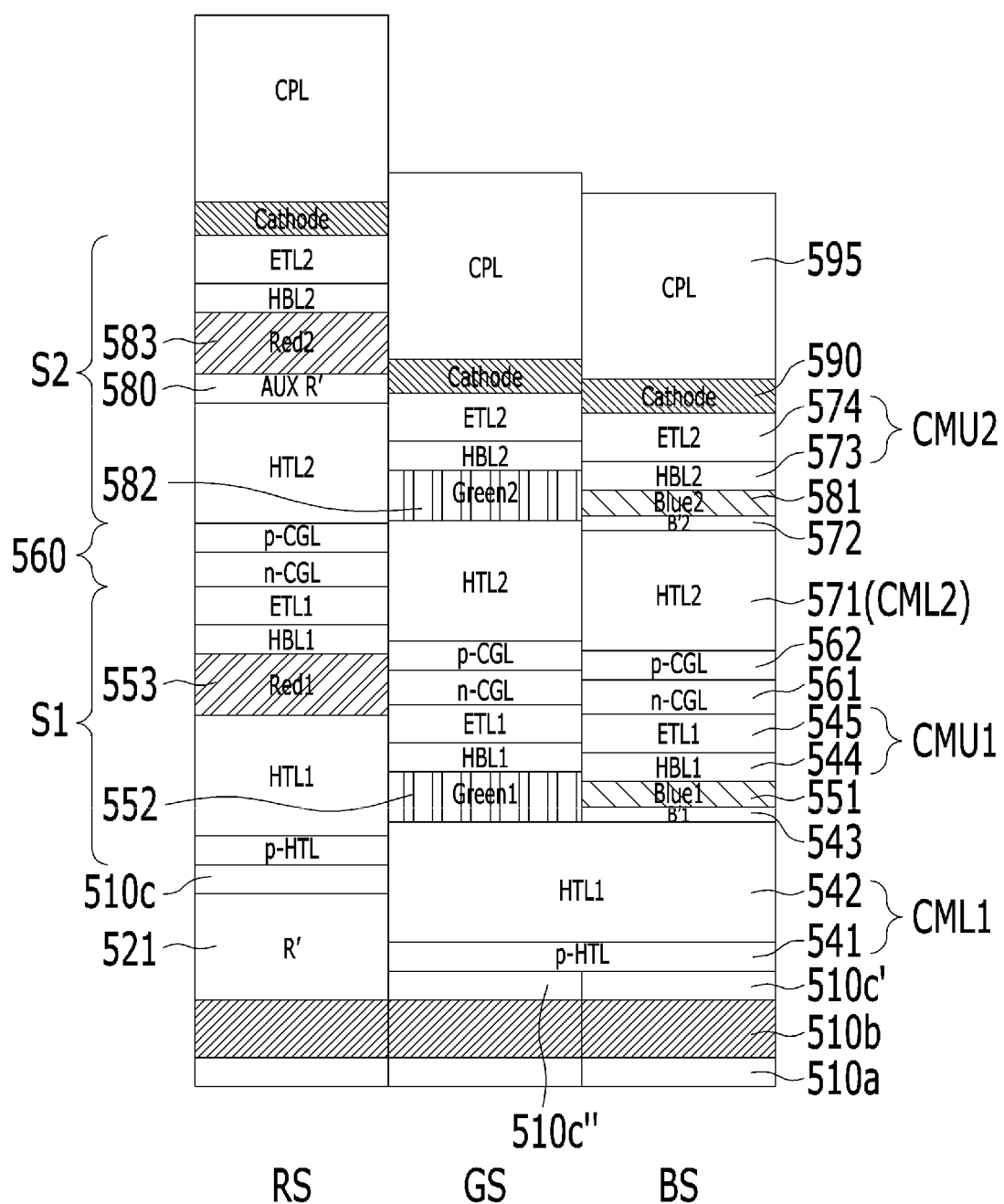
FIG. 9 is a cross-sectional view illustrating a light emitting display device according to a seventh embodiment of the present disclosure.

A light emitting display device according to the seventh embodiment of the present disclosure shown in FIG. 9 differs from the light emitting display device according to the fifth embodiment in that an auxiliary optical compensation layer 580 is provided only in a second stack S2 of a first subpixel RS. The auxiliary optical compensation layer 580 is provided on a third common layer CML2 in the second stack S2, and thereafter, a second red emission layer 583 is formed thereon. Further, in the first subpixel RS, an optical compensation layer 521 is provided between a reflective electrode 510b and an anode 510c.

The configurations of the light emitting display devices shown in FIGS. 8 and 9 are the same as that of the above-described light emitting display device according to the fifth embodiment except that the auxiliary optical compensation layer 550 or 580 is selectively provided in the first stack S1 or the second stack S2, between the anode 510c and a cathode 590 in the first subpixel RS, and thus, respective layers, which are not described above, will be described in brief.

First, the following description will be given based on the first subpixel RS.

A first common layer CLM1 is provided under the auxiliary optical compensation layer 550 and the first red emission layer 553, stacked on the auxiliary optical compensation layer 550, of the first stack S1, and the first common layer CLM1 of the first stack S1 includes a hole injection layer 541 and a first hole transport layer 542.

A second common layer CMU1 formed by stacking a first hole blocking layer 544 and a first electron transport layer 545 is provided on the first red emission layer 553.

A third common layer CML2 is provided under a second red emission layer 583 of the second stack S2, and the third common layer CML2 includes a second hole transport layer 571.

A fourth common layer CMU2 formed by stacking a second hole blocking layer 573 and a second electron transport layer 574 is provided on the second red emission layer 583.

The common layers CML1, CMU1, CML2 and CMU2, a charge generation layer 560, the cathode 590 and a capping layer 595 are provided in common in respective subpixels RS, BS and GS. Further, in the respective subpixels RS, BS and GS, a transparent electrode 510a is provided under the reflective electrode 510b. While the optical compensation layer 521 is provided on the reflective electrode 510b in the first subpixel RS, anodes 510c' and 510c" are directly provided on the reflective electrodes 510b in the second and third subpixels BS and GS.

The second subpixel BS may further include electron blocking layers 543 and 572 so as to prevent electrons or excitons from first and second blue emission layers 551 and 581 having a small thickness from moving towards the first common layer CML1 and the third common layer CML2 provided thereunder.

Figure 10:
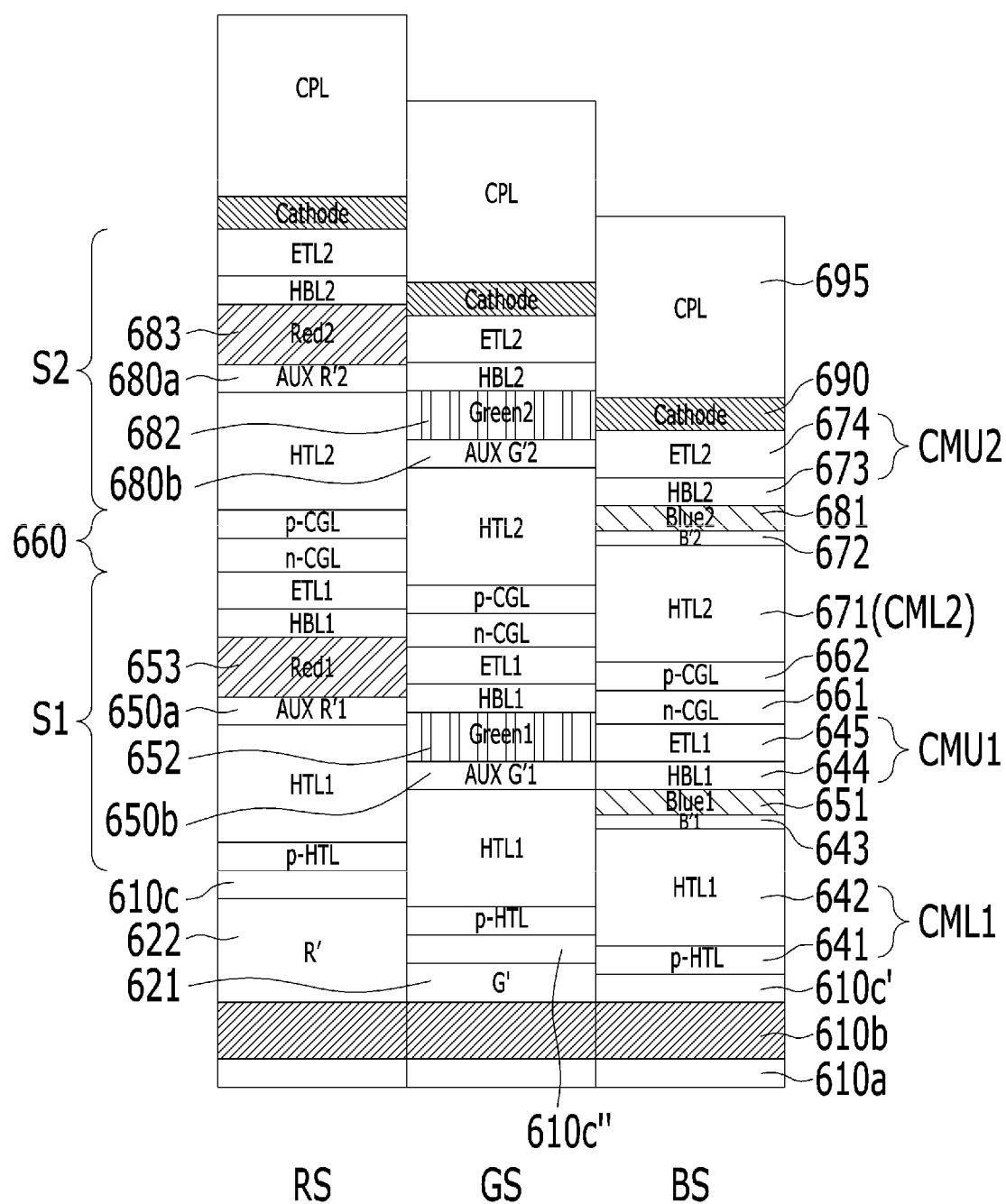
FIG. 10 is a cross-sectional view illustrating a light emitting display device according to an eighth embodiment of the present disclosure.

As shown in FIG. 10, a light emitting display device according to the eighth embodiment of the present disclosure differs from the light emitting display deice according to the fifth embodiment in that optical compensation layers 622 and 621 and auxiliary optical compensation layers 650a, 680a, 650b and 680b (In the drawings, 650b and 680b are also described as "AUX G'1" and "AUX G' 2") are provided in respective stacks S1 and S2 of a first subpixel RS and a third subpixel GS.

Concretely, in the first subpixel RS, a first optical compensation layer 622 may be provided between a reflective electrode 610b and an anode 610c, and thereby, the positions of first and second red emission layers 653 and 683 of the first and second stacks S1 and S2 may be adjusted upwards.

Further, in the third subpixel GS, a second optical compensation layer 621 may be provided between the reflective electrode 610b and an anode 610c'', and thereby, the positions of first and second green emission layers 652 and 682 of the first and second stacks S1 and S2 may be adjusted upwards.

A transparent electrode 610a is provided under the reflective electrode 610b in common in the respective subpixels RS, BS and GS.

In this case, the second subpixel BS has a three-layer stack structure including the transparent electrode 610a, the reflective electrode 610b and an anode 610c', and these electrodes 610a, 610b and 610c' may be conductively connected.

The first stack S1 in the first subpixel RS may include a first common layer CML1, the first auxiliary optical compensation layer 650a, the first red emission layer 653 and a second common layer CMU1. The first stack S1 in the second subpixel BS may include the first common layer CML1, a first blue emission layer 651 and the second common layer CMU1. The first stack S1 in the third subpixel GS may include the first common layer CML1, the second auxiliary optical compensation layer 650b, a first green emission layer 652 and the second common layer CMU1.

The first common layer CML1 may include a hole injection layer 641 and a first hole transport layer 642, in the same manner as the first common layer CML shown in FIG. 1.

The first auxiliary optical compensation layer 650a and the second auxiliary optical compensation layer 650b are provided so as to compensate for fine distribution deviations among equipment and the subpixels during a process for stacking organic layers after formation of the anode 610c, and are formed to have respective thicknesses less than the thicknesses of the first and second optical compensation layers 622 and 621 configured to mainly adjust an optical distance. The thicknesses of the first and second auxiliary optical compensation layers 650a and 650b are less than or equal to 0.22 times the thicknesses of the first and second optical compensation layers 622 and 621, and particularly, may be selected from a range within which distribution characteristics may be compensated for without increasing driving voltage. The first and second auxiliary optical compensation layers 650a and 650b may be respectively formed using the same masks in the same chambers as the first red emission layer 653 and the first green emission layer 652. The first auxiliary optical compensation layer 650a may be formed of the same material as a red host for forming the first red emission layer 653, and the second auxiliary optical compensation layer 650b may be formed of the same material as a green host for forming the first green emission layer 652. That is, prior to formation of the first red emission layer 653 and the first green emission layer 652, the first auxiliary optical compensation layer 650a is formed by depositing a red host material to a small thickness, and the second auxiliary optical compensation layer 650b is formed by depositing a green host material to a small thickness.

As shown in this figure, a first electron blocking layer 643 may be further provided in the second subpixel BS. The first electron blocking layer 643 is the same as the above-described first electron blocking layer 343, and thus a detailed description thereof will be omitted.

Further, the second common layer CMU1 is provided on each of the first red emission layer 653, the first blue emission layer 651 and the first green emission layer 652 of the first stacks S1 in the respective subpixels RS, BS and GS. The second common layer CMU1 may include a first hole blocking layer 644 and a first electron transport layer 645.

The charge generation layer 660 may include, for example, an n-type charge generation layer 661 configured to contribute to electron generation and to assist in electron transport from the lower stack, and a p-type charge generation layer 662 configured to contribute to hole generation and to assist in hole transport to the upper stack.

The second stack S2 may include a third common layer CML2, an emission layer 683, 681 or 682, and a fourth common layer CMU2, on the charge generation layer 660 in a corresponding one of the respective subpixels RS, BS and GS.

The third common layer CML2 may include a second hole transport layer 671, and the fourth common layer CMU2 may include a second hole blocking layer 673 and a second electron transport layer 674.

Further, a third auxiliary optical compensation layer 680a may be further provided between the third common layer CML2 and the second red emission layer 683 of the second stack S2 in the first subpixel RS, a second electron blocking layer 672 may be further provided between the third common layer CML2 and the second blue emission layer 681 of the first stack S2 in the second subpixel BS, and a fourth auxiliary optical compensation layer 680b may be further provided between the third common layer CML2 and the second green emission layer 682 of the second stack S2 in the third subpixel GS.

The light emitting display device according to the eighth embodiment applies compensation structures, such as an optical compensation layer and an auxiliary optical compensation layer, to the third subpixel GS for emitting light with a middle wavelength in addition to the first subpixel RS for emitting light with a long wavelength, compared to the light emitting display device according to the fourth embodiment, thereby being capable of adjusting optical distances and more finely adjusting fine distribution deviations among equipment and the subpixels.

A cathode 690 and a capping layer 695 may be sequentially provided on the second stack S2.

Figure 11:
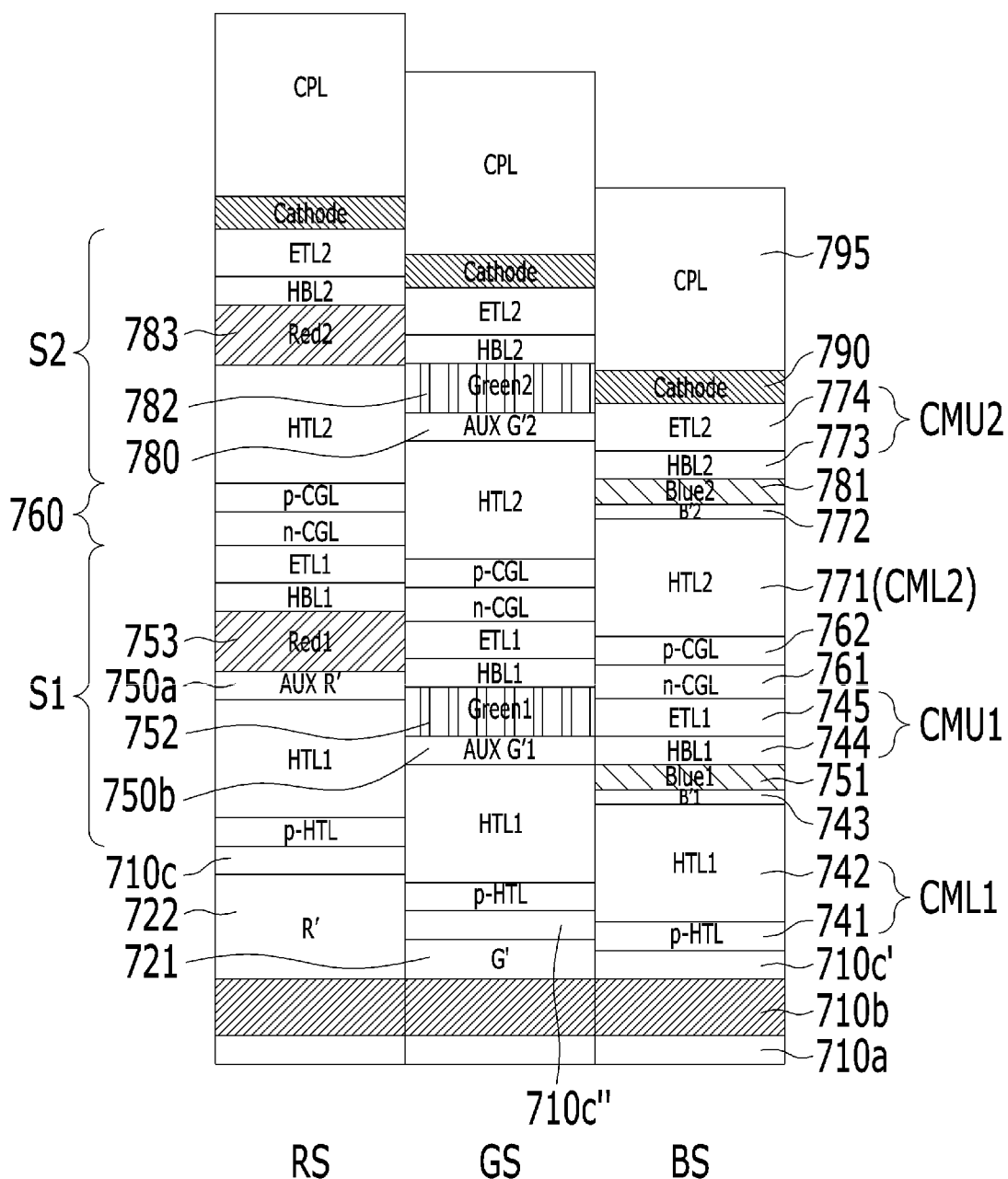
FIG. 11 is a cross-sectional view illustrating a light emitting display device according to a ninth embodiment of the present disclosure.

As shown in FIG. 11, a light emitting display device according to the ninth embodiment of the present disclosure has the same configuration as the light emitting display device according to the eighth embodiment except that no auxiliary optical compensation layer is provided in a second stack S1 of a first subpixel RS.

Respective layers, which are not described above, will be described in brief.

First, the following description will be given based on the first subpixel RS.

A first optical compensation layer 722 is provided between a reflective electrode 710b and an anode 710c.

Further, a first common layer CLM1 is provided under a first auxiliary optical compensation layer 750a and a first red emission layer 753, stacked on the first auxiliary optical compensation layer 750a, of the first stack S1, and the first common layer CML1 of the first stack S1 includes a hole injection layer 741 and a first hole transport layer 742.

A second common layer CMU1 formed by stacking a first hole blocking layer 744 and a first electron transport layer 745 is provided on the first red emission layer 753.

A third common layer CML2 is provided under a second red emission layer 783 of the second stack S2, and the third common layer CML2 includes a second hole transport layer 771.

A fourth common layer CMU2 formed by stacking a second hole blocking layer 773 and a second hole transport layer 774 is provided on the second red emission layer 783.

The common layers CLM1, CMU1, CML2 and CMU2, a charge generation layer 760, a cathode 790 and a capping layer 795 are provided in common in respective subpixels RS, BS and GS. Further, in the respective subpixels RS, BS and GS, a transparent electrode 710a is provided under the reflective electrode 710b. While the first optical compensation layer 722 is provided on the reflective electrode 710b in the first subpixel RS, an anode 710c' is directly provided on the reflective electrodes 710b in the second subpixel BS. Further, a second optical compensation layer 721 having a thickness less than the thickness of the first optical compensation layer 722 is provided on the reflective electrode 710b in the third subpixel GS.

The second subpixel BS may further include electron blocking layers 743 and 772 so as to prevent electrons or excitons generated from first and second blue emission layers 751 and 781 having a small thickness from moving towards the first common layer CML1 and the third common layer CML2 provided thereunder.

Further, the third subpixel GS includes a second auxiliary optical compensation layer 750b and a third auxiliary optical compensation layer 780 in the first stack S1 and the second stack S2.

In this case, the second and third auxiliary optical compensation layers 750b and 780 may be formed by supplying a host for forming a green emission layer, before formation of first and second green emission layers 752 and 782 adjacent thereto.

Although the above-described embodiments describe the two-stack structure, the light emitting display device according to the present invention is not limited to the two-stack structure. The configuration of the light emitting display device according to the present disclosure may be applied to a structure including three or more stacks, or may be applied to a structure in which the number of stacks varies in red, green and blue light emitting devices. The light emitting display device according to the present disclosure is characterized in that an optical compensation layer for adjusting the optical distance of the emission layer of each stack is located between a reflective electrode and an anode and an auxiliary optical compensation layer configured to realize fine adjustment may be additionally provided in an organic stack. In the structure having the above-described optical compensation layer, the auxiliary optical compensation layer may be provided in each of the stacks, or may be provided in some of the stacks. Further, the auxiliary optical compensation layer may be provided in all of the subpixels having the optical compensation layer, or may be selectively provided in some of the subpixels having the optical compensation layer.

Hereinafter, driving voltage-current density characteristics and driving voltage-current characteristics of light emitting devices according to Test Example 1 Ex1, in which an optical compensation layer is provided in an organic stack between an anode and a cathode, and Test Example 2 Ex2, in which an optical compensation layer is provided between a reflective electrode and an anode, like the first subpixel RS of FIG. 9, will be described.

Figure 12:
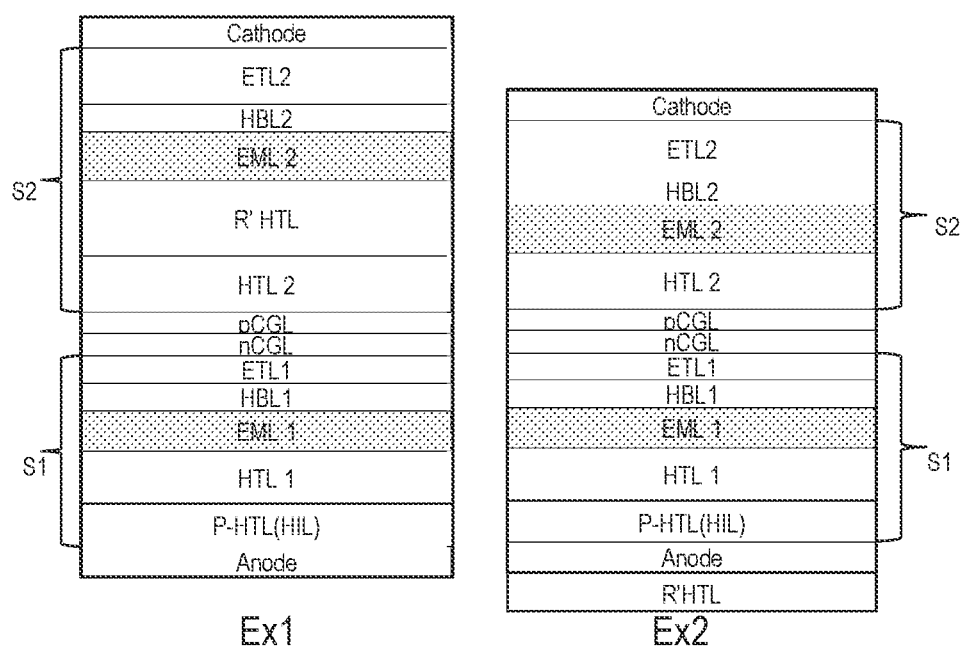
FIG. 12 is a cross-sectional view illustrating light emitting devices according to Test Examples 1 and 2.
Figure 13:
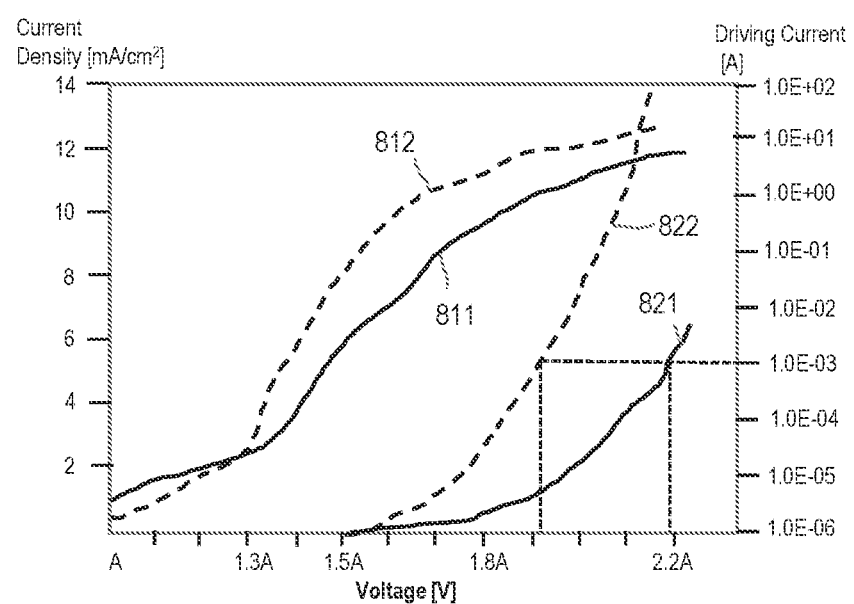
FIG. 13 is a graph showing driving voltage-current density characteristics and driving voltage-current characteristics of the light emitting devices according to Test Examples 1 and 2.

FIG. 12 is a cross-sectional view illustrating the light emitting devices according to Test Examples 1 and 2, and FIG. 13 is a graph showing driving voltage-current density characteristics and driving voltage-current characteristics of the light emitting devices according to Test Examples 1 and 2.

FIG. 12 shows the respective layer structures, each of which includes the anode, the cathode, and organic stacks provided therebetween, in the light emitting devices according to Test Examples 1 and 2 Ex1 and Ex2.

In the light emitting devices according to Test Examples 1 and 2 Ex1 and Ex2, two stacks are provided, and the two stacks are stacked with an n-type charge generation layer nCGL and a p-type charge generation layer pCGL interposed therebetween.

The light emitting devices according to Test Examples 1 and 2 include in common a hole injection layer HIL, a first hole transport layer HTL1, a first emission layer EML1, a first hole blocking layer HBL1 and a first electron transport layer ETL1, which are sequentially stacked on the anode, in the first stack S1. Further, the light emitting device according to Test Example 1 includes a second hole transport layer HTL2, an optical compensation layer R'HTL, a second emission layer EML2, a second hole blocking layer HBL2 and a second electron transport layer ETL2, which are sequentially stacked, in the second stack S2.

In the light emitting device according to Test Example 2, because the optical compensation layer R'HTL is located under the anode, the second stack S2 according to Test Example 2 excludes the optical compensation layer R'HTL, compared to the second stack S2 according to Test Example 1 including the optical compensation layer R'HTL.

Referring to FIG. 13, as results of an examination of the current densities of the light emitting devices according to Test Example 1 Ex1 and Test Example 2 Ex2 through a first curve 811 and a second curve 812 while changing driving voltage from A V to 2.2A V, it may be confirmed that the current density of the light emitting device according to Test Example 2 Ex2 increases from the driving voltage of about 1.3A V.

Further, it may be confirmed that, when the driving voltage is higher than or equal to 1.5A V, the current value of the light emitting device according to Test Example 2 Ex2, shown in a fourth curve 822, increases, compared to the current value of the light emitting device according to Test Example 1 Ex1, shown in a third curve 821, and, for example, in order to acquire driving current of 1.0E-03 A, the light emitting device according to Test Example 2 Ex2 requires driving voltage of 1.9A V and the light emitting device according to Test Example 1 Ex1 requires driving voltage of 2.2A V. That is, in order to acquire the same driving current of 1.0E-03 A, the light emitting device according to Test Example 2 Ex2 requires driving voltage of 86%, i.e., 1.9A/2.2A, compared to the light emitting device according to Test Example 1 Ex1, and may thus acquire a driving voltage reduction effect by 14%. Further, it may be confirmed that, as the current value increases, the driving voltage reduction effect is further improved. Here, A V is an initial voltage required to turn on the light emitting device, and may be changed from 2 V to 5 V.

As such, the light emitting display device according to the present disclosure includes an optical compensation layer located between a reflective electrode and an anode rather than between the anode and a cathode, thereby being capable of reducing the thickness of an organic stack causing a rise in driving voltage. Further, the optical compensation layer is located between the reflective electrode and the anode so as to be provided in a thin film transistor array formation process rather than in a deposition process for forming the organic stack, thereby being capable of omitting use of a fine metal mask and a chamber for formation of the optical compensation layer and thus increasing process yield.

Further, the optical compensation layer located between the reflective electrode and the anode is formed of a transparent inorganic insulating film, thereby being capable of reducing the use of an organic material required by the organic stack, and remarkably decreasing driving voltage due to a decrease in the thickness of the organic stack in the light emitting device. Further, current may be increased at the same driving voltage.

In addition, an auxiliary optical compensation layer configured to adjust fine differences among respective subpixels required by respective equipment in the organic stack is formed together with formation of an emission layer through a process for forming the emission layer, and thus, fine adjustment in the respective subpixels may be achieved without adding a separate mask.

Moreover, in a structure having a plurality of organic stacks, an auxiliary optical compensation layer is provided in each of the stacks or provided in at least some of the stacks so as to be adjacent to an emission layer, and has a thickness of less than or equal to 0.22 times the thickness of the optical compensation layer, thereby being capable of maintaining the driving voltage reduction effect without greatly increasing the thickness of the organic stack, and compensating for structural differences depending on equipment.

For this purpose, a light emitting display device according to one embodiment of the present invention may include a substrate including first subpixels and second subpixels, a first reflective electrode and a second reflective electrode provided at the first subpixels and the second subpixels, respectively, a first optical compensation layer provided on the first reflective electrode, a first anode configured to contact the first optical compensation layer and a second anode configured to contact the second reflective electrode, a first unit configured to have at least one first stack including a first common layer, a first emission layer configured to emit light with a first wavelength, and a second common layer, which are sequentially stacked on the first anode, a second unit configured to have at least one second stack including the first common layer, a second emission layer configured to emit light with a second wavelength shorter than the first wavelength, and the second common layer, which are sequentially stacked on the second anode, and a cathode provided on the first and second units.

The first optical compensation layer may be a transparent inorganic insulating film.

The light emitting display device may further include a first auxiliary optical compensation layer provided between the first common layer and the first emission layer.

The first auxiliary optical compensation layer may have the same width as the first emission layer.

The thickness of the first auxiliary optical compensation layer may be less than or equal to 0.22 times the thickness of the first optical compensation layer.

A plurality of first stacks in the first subpixels may be divided from each other and a plurality of second stacks in the second subpixels may be divided from each other, by a charge generation layer provided in common in the first and second subpixels, and a first auxiliary optical compensation layer may be further provided between the first common layer and the first emission layer in at least one of the plurality of first stacks.

The first anode and the first reflective electrode may extend from one side of the first optical compensation layer so as to be connected to each other.

The light emitting display device may further include first and second thin film transistors respectively provided at the first and second subpixels of the substrate, a protective film configured to cover the first and second thin film transistors, and first and second contact holes formed through the protective film so as to expose a part of each of the first and second thin film transistors, and the first and second reflective electrodes may be respectively connected to the first and second thin film transistors through the first and second contact holes.

The first contact hole may overlap a connection region between the first anode and the first reflective electrode.

The first auxiliary optical compensation layer may include the same material as a host of the first emission layer.

The substrate may further include third subpixels, the light emitting display device may further include a third reflective electrode and a third anode, provided on the third reflective electrode, at the third subpixels, and at least one third stack including the first common layer, a third emission layer configured to emit light with a third wavelength between the first wavelength and the second wavelength, and the second common layer, which are sequentially stacked on the third anode, and the cathode may be provided on the at least one third stack.

The light emitting display device may further include a second optical compensation layer provided between the third reflective electrode and the third anode so as to have a thickness less than a thickness of the first optical compensation layer.

The light emitting display device may further include a second auxiliary optical compensation layer provided between the first common layer and the third emission layer.

The thickness of the first emission layer, the thickness of the third emission layer, and the thickness of the second emission layer may be decreased in order, and an electron blocking layer may be further provided between the first common layer and the second emission layer.

A light emitting display device according to another embodiment of the present invention may include a substrate configured to have first to third subpixels, first to third reflective electrodes respectively provided at the first to third subpixels, a first optical compensation layer provided on the first reflective electrode, a second optical compensation layer provided on the third reflective electrode so as to have a thickness less than a thickness of the first optical compensation layer, a first anode configured to contact the first optical compensation layer, a second anode configured to contact the second reflective electrode, a third anode configured to contact the second optical compensation layer, a bank configured to overlap edges of the first to third anodes and to open first to third emission parts at the first to third subpixels, a first common layer provided on the first to third emission parts and the bank, first to third emission layers respectively provided at the first to third emission parts, a second common layer provided on the first to third emission layers, and a cathode provided on the second common layer.

The first optical compensation layer and the second optical compensation layer may be transparent inorganic insulating films.

The light emitting display device may further include a first auxiliary optical compensation layer provided between the first common layer and the first emission layer.

The light emitting display device may further include a second auxiliary optical compensation layer provided between the first common layer and the third emission layer.

The first auxiliary optical compensation layer may have the same width as the first emission layer, and the second auxiliary optical compensation layer may have the same width as the third emission layer.

The thickness of the first auxiliary optical compensation layer may be less than or equal to 0.22 times the thickness of the first optical compensation layer, and the thickness of the second auxiliary optical compensation layer may be less than or equal to 0.22 times the thickness of the second optical compensation layer.

The light emitting display device may further include at least one first stack emission layer configured to overlap the first emission layer in the first subpixels, at least one second stack emission layer configured to overlap the second emission layer in the second subpixels, at least one third stack emission layer configured to overlap the third emission layer in the third subpixels, a first stack common layer provided between the at least one first, second and third stack emission layers, located in the same layer, and the second common layer, and a second stack common layer provided between the at least one first, second and third stack emission layers and the cathode, in a vertical structure of each of the first to third subpixels.

The first to third anodes may be transparent electrodes, and the cathode may be a transflective electrode or a transmissive electrode.

The first to third reflective electrodes may be respectively connected to thin film transistors provided on the substrate by first to third transparent electrode layers interposed therebetween.

As is apparent from the above description, a light emitting display device according to the present disclosure has the following effects.

First, an optical compensation layer is located between a reflective electrode and an anode rather than between the anode and a cathode, thereby being capable of reducing the thickness of an organic stack causing a rise in driving voltage. Further, the optical compensation layer is located between the reflective electrode and the anode so as to be provided in a thin film transistor array formation process rather than in a deposition process for forming the organic stack, thereby being capable of omitting use of a fine metal mask and a chamber for formation of the optical compensation layer and thus increasing process yield.

Second, the optical compensation layer located between the reflective electrode and the anode is formed of a transparent inorganic insulating film, thereby being capable of reducing the use of an organic material required by the organic stack, and remarkably decreasing driving voltage due to a decrease in the thickness of the organic stack in the light emitting device. Further, current may be increased at the same driving voltage.

Third, an auxiliary optical compensation layer configured to adjust fine differences depending on respective subpixels required by respective equipment in the organic stack is formed together with formation of an emission layer through a process for forming the emission layer, and thus, fine adjustment in the respective subpixels may be achieved without adding a separate mask.

Fourth, in a structure having a plurality of organic stacks, an auxiliary optical compensation layer is provided in each of the stacks or provided in at least some of the stacks so as to be adjacent to an emission layer, and has a thickness of less than or equal to 0.22 times the thickness of the optical compensation layer, thereby being capable maintaining the driving voltage reduction effect without greatly increasing the thickness of the organic stack, and compensating for structural differences depending on equipment.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A light emitting display device comprising:
   a substrate comprising first subpixels and second subpixels;
   a plurality of thin film transistors including a first thin film transistor and a second thin film transistor;
   a first transparent electrode and a second transparent electrode at the first subpixels and the second subpixels, respectively;
   a first reflective electrode on the first transparent electrode and connected to the first thin film transistor via the first transparent electrode, and a second reflective electrode on the second transparent electrode and connected to the second thin film transistor via the second transparent electrode;
   a first optical compensation layer on the first reflective electrode;
   a first anode to contact the first optical compensation layer, the first optical compensation layer between the first anode and the first reflective electrode;
   a second anode to contact the second reflective electrode;
   a first unit having at least one first stack comprising a first common layer, a first emission layer to emit light with a first wavelength, and a second common layer, which are sequentially stacked on the first anode;
   a second unit having at least one second stack comprising the first common layer, a second emission layer to emit light with a second wavelength that is less than the first wavelength, and the second common layer, which are sequentially stacked on the second anode; and
   a cathode on the first unit and the second unit.

2. The light emitting display device according to claim 1, wherein the first optical compensation layer is a transparent inorganic insulating film.

3. The light emitting display device according to claim 1, further comprising a first auxiliary optical compensation layer between the first common layer and the first emission layer.

4. The light emitting display device according to claim 3, wherein the first auxiliary optical compensation layer has a same width as the first emission layer.

5. The light emitting display device according to claim 3, wherein a thickness of the first auxiliary optical compensation layer is less than or equal to 0.22 times a thickness of the first optical compensation layer.

6. The light emitting display device according to claim 1, wherein:
   a plurality of first stacks in the first subpixels are divided from each other and a plurality of second stacks in the second subpixels are divided from each other, by at least one charge generation layer provided in common in the first subpixels and the second subpixels; and
   a first auxiliary optical compensation layer is further provided between the first common layer and the first emission layer in at least one of the plurality of first stacks.

7. The light emitting display device according to claim 6, wherein the first auxiliary optical compensation layer comprises a same material as a host of the first emission layer.

8. The light emitting display device according to claim 1, wherein a portion of the first anode and a portion of the first reflective electrode extend from a side of the first optical compensation layer and are in contact with each other without the first optical compensation layer being disposed between the portion of the first anode and the portion of the first reflective electrode.

9. The light emitting display device according to claim 8, further comprising:
 a protective film to cover the first thin film transistors and the second thin film transistors; and
 a first contact hole and a second contact hole through the protective film to expose a part of each of the first thin film transistors and the second thin film transistors,
 wherein the first reflective electrode and the second reflective electrode are respectively connected to each of the first thin film transistors and the second thin film transistors through the first transparent electrode disposed in the first contact hole and the second transparent electrode disposed in the second contact hole.

10. The light emitting display device according to claim 9, wherein the first contact hole overlaps a connection region between the first anode and the first reflective electrode.

11. The light emitting display device according to claim 1, wherein the substrate further comprises third subpixels,
 wherein the light emitting display device further comprises:
 a third reflective electrode and a third anode, provided on the third reflective electrode, at the third subpixels; and
 at least one third stack comprising the first common layer, a third emission layer configured to emit light with a third wavelength between the first wavelength and the second wavelength, and the second common layer, on the third anode,
 wherein the cathode is provided on the at least one third stack.

12. The light emitting display device according to claim 11, further comprising a second optical compensation layer between the third reflective electrode and the third anode having a thickness less than a thickness of the first optical compensation layer.

13. The light emitting display device according to claim 11, further comprising a second auxiliary optical compensation layer between the first common layer and the third emission layer.

14. The light emitting display device according to claim 11, wherein:
 a thickness of the first emission layer, a thickness of the third emission layer, and a thickness of the second emission layer are decreased in order; and
 an electron blocking layer is further provided between the first common layer and the second emission layer.

15. A light emitting display device comprising:
 a substrate having a first subpixel, a second subpixel, and a third subpixel;
 a first reflective electrode, a second reflective electrode and a third reflective electrode respectively provided at the first to third subpixels;
 a first optical compensation layer on the first reflective electrode, and a second optical compensation layer on the third reflective electrode having a thickness that is less than a thickness of the first optical compensation layer;
 a first anode to contact the first optical compensation layer, the first optical compensation layer between the first anode and the first reflective electrode;
 a second anode to contact the second reflective electrode;
 a third anode to contact the second optical compensation layer, the second optical compensation layer between the third anode and the third reflective electrode;
 a bank to overlap edges of the first to the third anodes and to open a first emission part, a second emission part and a third emission part in the first to third subpixels;
 a first common layer on the first to the third emission parts and the bank;
 a first emission layer at the first emission part, a second emission layer at the second emission part and a third emission layer at the third emission part, respectively, wherein the first to third emission layers are on the first common layer;
 a second common layer on the first to third emission layers; and
 a cathode on the second common layer,
 wherein the first to third reflective electrodes are respectively connected to thin film transistors on the substrate by first to third transparent electrode layers interposed therebetween.

16. The light emitting display device according to claim 15, wherein the first optical compensation layer and the second optical compensation layer are transparent inorganic insulating films.

17. The light emitting display device according to claim 15, further comprising at least one of a first auxiliary optical compensation layer between the first common layer and the first emission layer and a second auxiliary optical compensation layer between the first common layer and the third emission layer.

18. The light emitting display device according to claim 17, wherein:
 the first auxiliary optical compensation layer has a same width as the first emission layer; and
 the second auxiliary optical compensation layer has a same width as the third emission layer.

19. The light emitting display device according to claim 15, wherein:
 the first to third anodes are transparent electrodes; and
 the cathode is a transflective electrode or a transmissive electrode.

20. A light emitting display device comprising:
 a substrate comprising first subpixels and second subpixels;
 a first reflective electrode and a second reflective electrode at the first subpixels and the second subpixels, respectively;
 a first optical compensation layer on the first reflective electrode;
 a first anode to contact the first optical compensation layer, the first optical compensation layer between the first anode and the first reflective electrode;
 a second anode to contact the second reflective electrode;
 a first unit having at least one first stack comprising a first common layer, a first emission layer to emit light with a first wavelength, and a second common layer, which are sequentially stacked on the first anode;
 a first auxiliary optical compensation layer between the first common layer and the first emission layer;
 a second unit having at least one second stack comprising the first common layer, a second emission layer to emit light with a second wavelength that is less than the first wavelength, and the second common layer, which are sequentially stacked on the second anode; and
 a cathode on the first unit and the second unit.

* * * * *